(12) United States Patent
Shrivastava et al.

(10) Patent No.: US 12,206,376 B2
(45) Date of Patent: Jan. 21, 2025

(54) GLITCH MITIGATION IN SWITCHED REACTANCE PHASE SHIFTERS

(71) Applicant: pSemi Corporation, San Diego, CA (US)

(72) Inventors: Ravindranath Shrivastava, San Diego, CA (US); Peter Bacon, Derry, NH (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/943,626

(22) Filed: Jul. 30, 2020

(65) Prior Publication Data

US 2021/0021257 A1 Jan. 21, 2021

Related U.S. Application Data

(62) Division of application No. 15/414,187, filed on Jan. 24, 2017, now abandoned.

(51) Int. Cl.
*H03H 11/20* (2006.01)
*H03H 7/20* (2006.01)

(52) U.S. Cl.
CPC .............. *H03H 11/20* (2013.01); *H03H 7/20* (2013.01)

(58) Field of Classification Search
CPC .......... H03H 7/20; H03H 11/22; H03H 11/16; H03H 11/18; H03H 11/20
See application file for complete search history.

(56) References Cited

U.S. PATENT DOCUMENTS

| 5,317,290 A | 5/1994 | Jacomb-Hood |
| 5,424,696 A | 6/1995 | Nakahara et al. |
| 5,519,349 A | 5/1996 | Nakahara |
| 5,521,499 A * | 5/1996 | Goldenberg .......... H04L 7/0337 327/284 |

(Continued)

FOREIGN PATENT DOCUMENTS

WO 2018140115 8/2018

OTHER PUBLICATIONS

Gamal El Din, et al., "Low Loss Multi-State Phase Shifter"; patent application filed in the USPTO on Feb. 5, 2016, U.S. Appl. No. 15/017,433, 37 pgs.

(Continued)

*Primary Examiner* — Patrick C Chen
(74) *Attorney, Agent, or Firm* — Steinfl + Bruno LLP

(57) ABSTRACT

A phase shifter cell and multiple coupled phase shifter cells that mitigate signal glitches arising from phase state changes by a combination of design architecture and control signal timing. Specifically, one or more of the following three concepts are employed to mitigate insertion loss glitches and control phase behavior during phase state transitions: the timing of switching for each switched half-cell (e.g., including series and/or shunt reactance elements, such as inductors and/or capacitors) within a phase shifter cell is controlled in such a way that the reactance elements do not all switch at the same time; use of a "make before break" timing scheme for combination or "multi-state" phase shifter cells; and/or arranging the timing of each phase shifter cell in a set of multiple coupled phase shifter cells such that the individual cells do not all switch at the same time.

36 Claims, 16 Drawing Sheets

(56) References Cited

U.S. PATENT DOCUMENTS

| | | | |
|---|---|---|---|
| 5,701,107 | A | 12/1997 | Kasahara et al. |
| 6,229,367 | B1 | 5/2001 | Choudhury |
| 6,281,838 | B1 | 8/2001 | Hong |
| 6,320,481 | B1 | 11/2001 | Sharma |
| 6,924,681 | B2 * | 8/2005 | Staszewski .......... H04B 1/0483 327/172 |
| 7,053,732 | B2 | 5/2006 | Zhou |
| 7,355,492 | B2 | 4/2008 | Hyman et al. |
| 7,764,142 | B2 | 7/2010 | Miya |
| 10,033,349 | B2 | 7/2018 | Gamal El Din et al. |
| 2010/0066427 | A1 * | 3/2010 | George ................ H03K 17/063 327/308 |
| 2013/0016982 | A1 * | 1/2013 | Henzler .............. H03H 11/265 398/184 |
| 2013/0194017 | A1 * | 8/2013 | Staudinger ........... H03F 1/3282 327/231 |
| 2015/0171828 | A1 | 6/2015 | Lam |
| 2015/0180109 | A1 | 6/2015 | Kroening |
| 2015/0244051 | A1 | 8/2015 | Domino |
| 2016/0112026 | A1 | 4/2016 | Kocer |
| 2016/0269008 | A1 * | 9/2016 | Facchini ................ H03F 3/193 |
| 2017/0033761 | A1 * | 2/2017 | Huang .................... H03H 7/20 |
| 2017/0230028 | A1 | 8/2017 | Game El Din et al. |
| 2017/0365925 | A1 * | 12/2017 | Jian ...................... H01Q 25/004 |
| 2018/0212590 | A1 | 7/2018 | Shrivastava et al. |

OTHER PUBLICATIONS

Chen, Patrick C., Office Action received from the USPTO dated Aug. 16, 2018 for U.S. Appl. No. 15/414,187, 6 pgs.

Chen, Patrick C., Office Action received from the USPTO dated Oct. 15, 2018 for U.S. Appl. No. 15/414,187, 31 pgs.

Chen, Patrick C., Final Office Action received from the USPTO dated Feb. 21, 2019 for U.S. Appl. No. 15/414,187, 13 pgs.

Chen, Patrick C., Advisory Action received from the USPTO dated Mar. 22, 2019 for U.S. Appl. No. 15/414,187, 4 pgs.

Chen, Patrick C., Office Action received from the USPTO dated Jun. 24, 2019 for U.S. Appl. No. 15/414,187, 16 pgs.

Chen, Patrick C., Final Office Action received from the USPTO dated Mar. 2, 2020 for U.S. Appl. No. 15/414,187, 19 pgs.

Chen, Patrick C., Advisory Action received from the USPTO dated Jun. 26, 2020 for U.S. Appl. No. 15/414,187, 4 pgs.

Chen, Patrick C., Notice of Abandonment received from the USPTO dated Aug. 6, 2020 for U.S. Appl. No. 15/414,187, 2 pgs.

Takaoka, Dean O., Office Action received from the USPTO dated Jul. 21, 2017 for U.S. Appl. No. 15/017,433, 15 pgs.

Gamel El Din, et al.., Response filed in the USPTO dated Oct. 23, 2017 for U.S. Appl. No. 15/017,433, 17 pgs.

Takaoka, Dean O., Final Office Action received from the USPTO dated Jan. 11, 2018 for U.S. Appl. No. 15/017,433, 23 pgs.

Camps, Ester, Invitation to Pay Additional Fees and, Where Applicable, Protest Fee received from the EPO dated Jan. 31, 2018 for appln. No. PCT/US2017/061617, 13 pgs.

De Hek, et al., "A Cost-effective High-Power S-band 6-bit Phase Shifter with Integrated LVCMOS Control Logic", Proceedings of the 37th European Microwave Conference, Oct. 2007, Munich, Germany, pp. 1261-1264, 4 pgs.

Doddamani, et al., "Design of SPDT Switch, 6 Bit Digital Attenuator, 6 Bit Digital Phase Shifter for L-Band T/R Module using 0.7 uM GaAs MMIC Technology", IEEE-ICSCN 2007, MIT Campus, Anna University, Chemai, India, Feb. 22-24, 2007, pp. 302-307, 6 pgs.

Singh, et al., "Integrated Digitally Controlled 6-Bit Phase Shifter, 4-Bit Attenuator, and T/R Switch using Multifunction Self Aligned Gate Process", IEEE 1991 Microwave and Millimeter-Wave Monolithic Circuits Symposium, pp. 39-41, 5 pgs.

Gamal El Din, et al., Response filed in the USPTO dated Feb. 13, 2018 for U.S. Appl. No. 15/017,433, 21 pgs.

Takaoka, Dean O., Advisory Action received from the USPTO dated Feb. 23, 2018 for U.S. Appl. No. 15/017,433, 3 pgs.

Takaoka, Dean O., Notice of Allowance received from the USPTO dated Mar. 26, 2018 for U.S. Appl. No. 15/017,433, 7 pgs.

Maget, Judith, International Search Report and Written Opinion received from the EPO dated Mar. 28, 2018 for appln. No. PCT/US2017/061617, 18 pgs.

Maget, Judith, International Preliminary Report on Patentability received from the EPO dated May 15, 2019 for appln. No. PCT/US2017/061617, 22 pgs.

PSemi Corporation, Response filed in the USPTO dated Sep. 5, 2018 for U.S. Appl. No. 15/414,187, 5 pgs.

PSemi Corporation, Response filed in the USPTO dated Nov. 7, 2018 for U.S. Appl. No. 15/414,187, 8 pgs.

PSemi Corporation, Response filed in the USPTO dated Mar. 5, 2019 for U.S. Appl. No. 15/414,187, 7 pgs.

PSemi Corporation, Response filed in the USPTO dated Nov. 25, 2019 for U.S. Appl. No. 15/414,187, 10 pgs.

PSemi Corporation, Response filed in the USPTO dated May 29, 2020 for U.S. Appl. No. 15/414,187, 11 pgs.

* cited by examiner

Timing Diagram 302

Timing Diagram 304

# GLITCH MITIGATION IN SWITCHED REACTANCE PHASE SHIFTERS

CROSS-REFERENCE TO RELATED APPLICATIONS—CLAIM OR PRIORITY

The present application is a divisional of, and claims priority to, co-pending and commonly assigned U.S. patent application Ser. No. 15/414,187, filed Jan. 24, 2017, entitled "Glitch Mitigation in Switched Reactance Phase Shifters", and the contents of said application is incorporated herein by reference in its entirety.

This application is related to U.S. patent application Ser. No. 15/017,433, filed on Feb. 5, 2016, entitled "Low Loss Multi-State Phase Shifter", now U.S. Pat. No. 10,033,349 issued Jul. 24, 2018, assigned to the assignee of the present invention, the contents of which are hereby incorporated by reference.

BACKGROUND

(1) Technical Field

This invention generally relates to electronic circuits, and more specifically to digital-step phase shifter circuits.

(2) Background

Electronic phase shifter circuits are used to change the transmission phase angle of a signal, and are commonly used to phase shift radio frequency (RF) signals. An RF phase shifter circuit may be implemented with different configurations of reactance elements (e.g., inductors and capacitors) and other components (e.g., resistors, switches, etc.). RF phase shifter circuits may be used for applications such as in-phase discriminators, beam forming networks, power dividers, linearization of power amplifiers, and phased array antennas, to name a few.

For many applications, it may be useful to serially-couple multiple phase shifter cells of the same or different phase shift values. Such phase shifter circuits may be digitally controlled and thus provide a discrete set of phase shift states or steps that are selected by a binary control word, directly or after decoding. Such phase shifter circuits may be binary-coded, thermometer coded, or a hybrid combination of the two types.

FIG. 1 is a block diagram of a conventional prior art 90° phase shifter cell 100. Two ports, P1, P2, either of which may be an input port to the phase shifter cell 100 for an RF signal or an output port for the phase shifter cell 100, are coupled to a −45° low pass filter (LPF) circuit 102 and a +45° high pass filter (HPF) circuit 104. The serially-coupled LPF circuit 102 and the HPF circuit 104 may also be considered to be "half-cells". A half-cell is considered to be in an inactive, decoupled, or OFF state when it is configured to allow an applied signal to pass through the half-cell essentially unmodified, and in an active, coupled, or ON state when it is configured to phase shift an applied signal.

In the illustrated example, the LPF circuit 102 has a conventional pi-type configuration, in which an inductor $L_{LPF}$ reactance element is series-coupled between ports P1 and P2, and in parallel with a through-path switch M1 controlled by a signal S1. Bracketing shunt capacitors $C_{LPF}$ may be coupled between respective ports P1 and P2 and a common potential (e.g., circuit ground) by corresponding switches M2 controlled by a signal S2.

In the illustrated example, the HPF circuit 104 has a conventional T-type configuration, in which a pair of capacitor $C_{HPF}$ reactance elements are series-coupled between ports P1 and P2, and in parallel with corresponding through-path switches M3 controlled by a signal S3. A shunt inductor $L_{HPF}$ may be coupled between a junction point between the pair of capacitor $C_{HPF}$ reactance elements and the common potential by a switch M4 controlled by a signal S4.

FIG. 2 is a timing diagram of conventional control signals for the phase shifter cell 100 shown in FIG. 1. In operation, the state of the control signals S1-S4 for the switches M1-M4 are controlled by a master control signal $V_C$. In this example, each switch M1-M4 is implemented as a field-effect transistor (FET) that becomes conductive ("ON") when its corresponding control signal is high, and non-conductive ("OFF") when its corresponding control signal is low (of course, the reverse logic could be implemented as well by suitable changes in components and control signals).

When $V_C$ is at a logic high, the phase shifter cell 100 is in a +45° high pass state; conversely, when $V_C$ is at a logic low, the phase shifter cell 100 is in a −45° low pass state. In the high pass state, S1 is high, S3 is low, S2 is low, and S4 is high. In the low pass state, S1 is low, S3 is high, S2 is high, and S4 is low. Thus, S1 and S3 are complementary with respect to each other, S2 and S4 are complementary with respect to each other, S1 and S2 are complementary with respect to each other, and S3 and S4 are complementary with respect to each other.

In this example, before time point "A", the phase shifter cell 100 is in a +45° high pass state: signals applied at port P1 pass through the inactive LPF circuit 102 via ON switch M1 (since S1 is high and S2 is low, the applied signals simply pass through the LPF circuit 102) and are phase shifted by the active HPF circuit 104 (since S3 is low and S4 is high). After time point "A", the phase shifter cell 100 is in a −45° low pass state: signals applied at port P1 are phase shifted by the active LPF circuit 102 (since S1 is low and S2 is high) and pass through the inactive HPF circuit 104 via ON switches M3 (since S3 is high and S4 is low, the applied signals simply pass through the HPF circuit 104). The logic state of $V_C$, and hence of the control signals S1-S2, is reversed to shift back to a +45° phase shift from a −45° phase shift.

A problem of the phase shifter cell 100 shown in FIG. 1 and other conventional phase shifter circuits (whether binary, thermometer, or hybrid coded) is that switching phase states results in undesirable RF switching transients ("glitches") from the switches M1-M4 during the concurrent transitions of the control signals S1-S4. The problem is compounded if multiple phase shifter cells 100 change phase shift state at the same time. Such glitches can cause significant variations in insertion loss, as well as extreme changes in the actual insertion phase.

Accordingly, there is a need for a phase shifter cell and for multiple coupled phase shifter cells that mitigate glitches arising from phase state changes. The present invention addresses this need.

SUMMARY OF THE INVENTION

The present invention encompasses a phase shifter cell and multiple coupled phase shifter cells that mitigate glitches arising from phase state changes. By understanding the vector impact of the individual phase shifter cell as it transitions, and of the entire phase shifter architecture, the total insertion loss glitch can be maintained to less than 1 dB and the phase transition made to be monotonic in its transition behavior.

These two behaviors are achieved by a combination of design architecture and control signal timing. Specifically, one or more of the following three concepts are employed to mitigate insertion loss glitches and control phase behavior during phase state transitions:

The timing of switching for each switched half-cell (e.g., including series and/or shunt reactance elements, such as inductors and/or capacitors) within a phase shifter cell is controlled in such a way that the reactance elements do not all switch (either ON or OFF) at the same time;

Use of a "make before break" timing scheme for combination or "multi-state" phase shifter cells; and/or Arranging the timing of each phase shifter cell (or "bit") in a set of multiple coupled phase shifter cells such that the individual cells do not all switch (either ON or OFF) at the same time.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention encompasses a phase shifter cell and multiple coupled phase shifter cells that mitigate glitches arising from phase state changes. By understanding the vector impact of the individual phase shifter cell as it transitions, and of the entire phase shifter architecture, the total insertion loss glitch can be maintained to less than 1 dB and the phase transition made to be monotonic in its transition behavior.

These two behaviors are achieved by a combination of design architecture and control signal timing. Specifically, one or more of the following three concepts are employed to mitigate insertion loss glitches and control phase behavior during phase state transitions:

The timing of switching for each switched half-cell (e.g., including series and/or shunt reactance elements, such as inductors and/or capacitors) within a phase shifter cell is controlled in such a way that the reactance elements do not all switch (either ON or OFF) at the same time;

Use of a "make before break" timing scheme for combination or "multi-state" phase shifter cells; and/or Arranging the timing of each phase shifter cell (or "bit") in a set of multiple coupled phase shifter cells such that the individual cells do not all switch (either ON or OFF) at the same time.

Switched Reactance Step-Wise Through-Path Phase Shifter Cell

Figure 1:
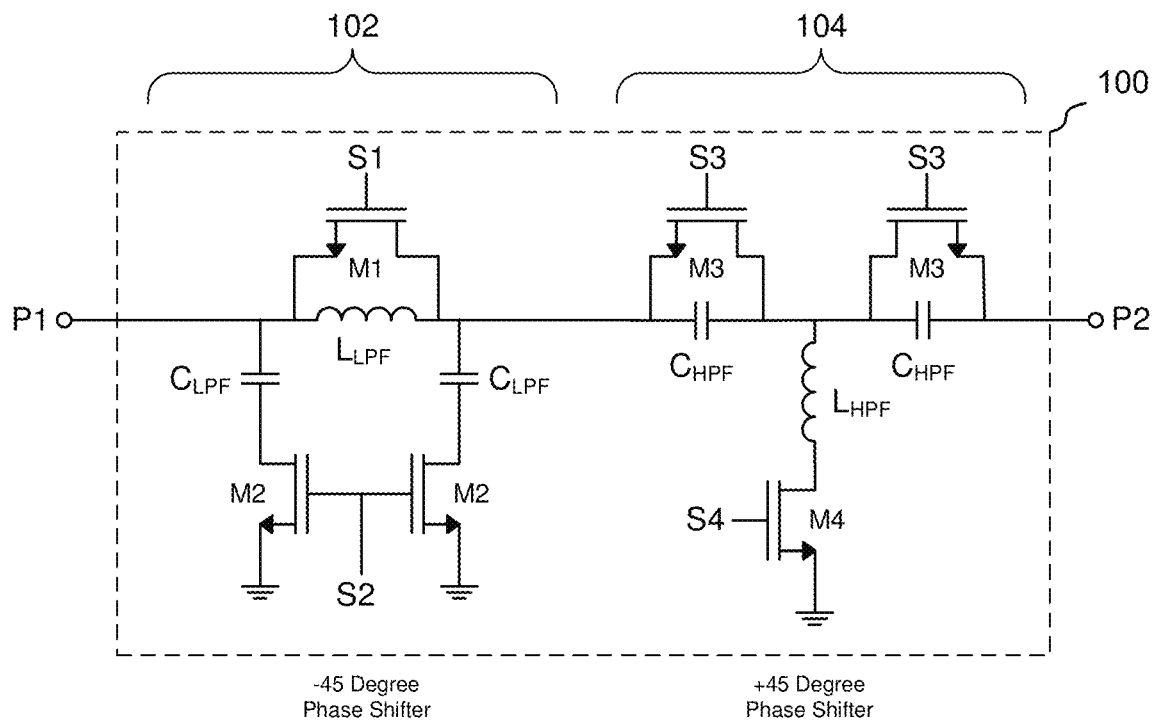
FIG. 1 is a block diagram of a conventional prior art 90° phase shifter cell.
Figure 2:
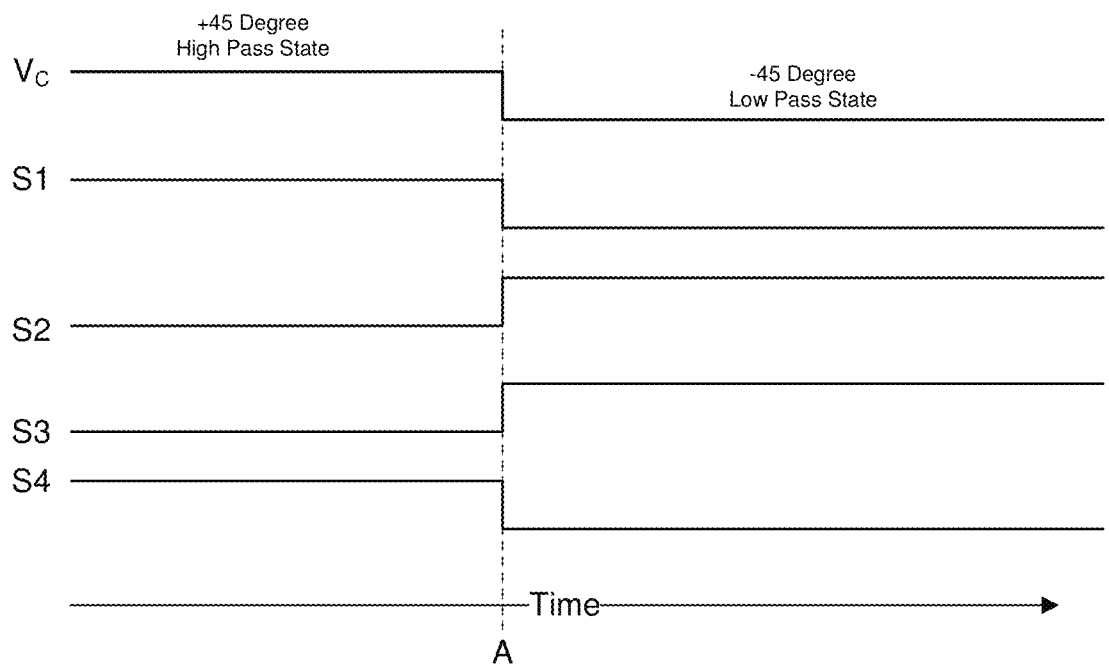
FIG. 2 is a timing diagram of conventional control signals for the phase shifter cell shown in FIG. 1.

In a phase shifter cell such as the type shown in FIG. 1, the degree of shift may be varied by changing the values and/or number of reactance elements within the phase shifter cell. Further, while pi-type and T-type configurations may be quite useful for the serially-coupled half-cells, other circuit configurations may be used to provide selectable phase states, including L-pad and bridged-T type phase shifter circuits. Accordingly, this disclosure is not limited to the specific phase shifter cell shown in FIG. 1.

Figure 3:
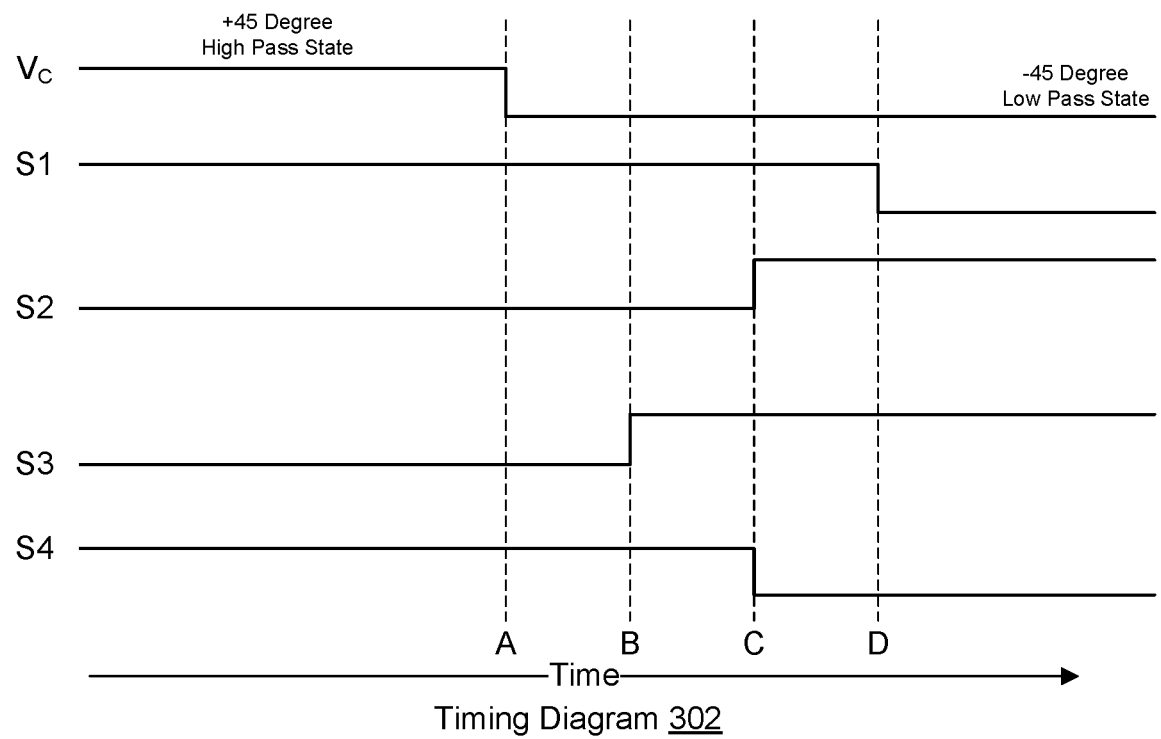
FIG. 3 is a pair of timing diagrams of an improved timing scheme for control signals for a phase shifter cell such as the type shown in FIG. 1.
Figure 3:
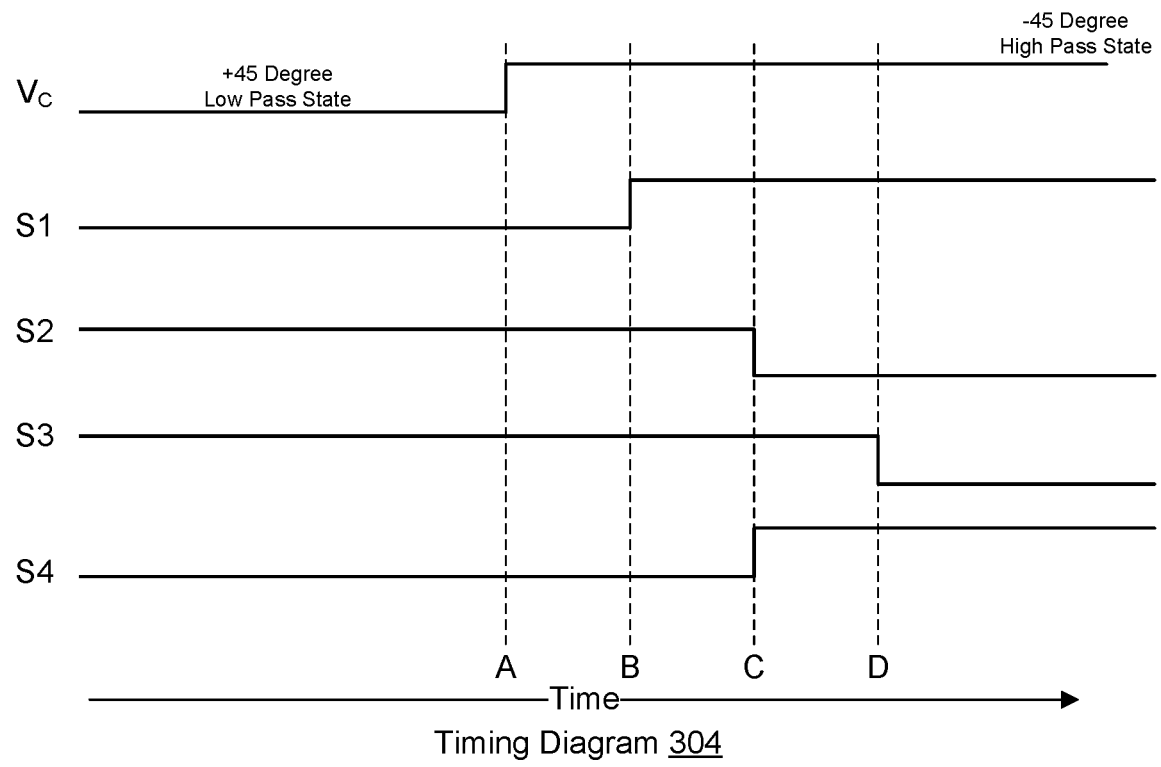

FIG. 3 is a pair of timing diagrams of an improved timing scheme for control signals for a phase shifter cell such as the type shown in FIG. 1. In this embodiment, the aim is to transition control signals S1-S4 smoothly transition in a step-wise fashion from a "high pass state" to a distinct "through-path state" and then to a "low pass state", and vice versa. Switching to a distinct intermediate "through-path state" makes sure that the phase transition is also smooth (e.g., from +45° to 0°, and then from 0° degree to −45°).

As shown in FIG. 3 in timing diagram 302, when the control voltage $V_C$ transitions from high to low at time point "A", a sequence of transitions occurs for control signals S1-S4. In this particular example, the control signals S1-S4 do not change immediately at time point "A", but only begin to change after an optional "cell delay" time expires at time point "B" (for reasons discussed below with respect to FIGS. 8 and 9). Just before time point "A", the LPF circuit 102 is inactive (since S1 is high and S2 is low, applied signals simply pass through the LPF circuit 102) and the HPF circuit 104 is active (since S3 is low and S4 is high). At delayed time point "B", S3 is changed from low to high, which makes switches M3 conductive, thus enabling the through-path of the high pass filter 104. Accordingly, signals applied at port P1 simply pass through without any appreciable phase shift (ideally, no phase shift) to port P2. The phase shifter cell 100 has thus transitioned from a "high pass state" to a "through-path state".

In this example, at time point "C", delayed a selected amount of time after time point "B", S2 is changed from low to high and S4 is changed from high to low, in a complementary fashion; however, other embodiments may separate the sequencing times for S2 and S4, or provide overlap of sequencing for S2 and S4. The phase shifter cell 100 is still in a "through-path state", since switches M1 and M3 are in a conductive state, thus bypassing $L_{LPF}$ and $C_{HPF}$, respectively, but is now configured to transition to the "low pass state". At time point "D", delayed a selected amount of time after time point "C", S1 is changed from high to low, thus activating the LPF circuit 102; the HPF circuit 104 is still inactive, since S3 is already high. The phase shifter cell 100 has thus transitioned from the "through-path state" to a "low pass state".

If the control voltage $V_C$ transitions from low to high, the delay sequence for transitioning from a "low pass state" to a "through-path state" and then to a "high pass state" would be as shown in timing diagram 304: at time point "B", S1 changes low to high; at time point "C", S2 changes from high to low and S4 changes from low to high; and at time point "D", S3 changes from high to low. As noted above, the sequencing of S2 and S4 need not be complementary; other embodiments may separate the sequencing times for S2 and S4, or provide overlap of sequencing for S2 and S4.

The improved timing scheme for control signals for a phase shifter cell having first and second phase shifter half-cell circuits may be summarized as shown in TABLE 1 (bolding indicates a change in switch state). Note that from the point of view of the half-cells, this switching scheme could be characterized as "break before make", since each half-cell is set to a through-path state between switching to opposite active states.

TABLE 1

|  | 1st Phase Shifter Half-Cell | | 2nd Phase Shifter Half-Cell | |
| --- | --- | --- | --- | --- |
|  | Series Reactance Sw | Shunt Sw | Series Reactance Sw | Shunt Sw |
| Initial State | ON | OFF | OFF | ON |
| 1st transition | ON | OFF | ON | ON |
| 2nd transition | ON | ON | ON | OFF |
| 3rd transition | OFF | ON | ON | OFF |

Figure 4A:
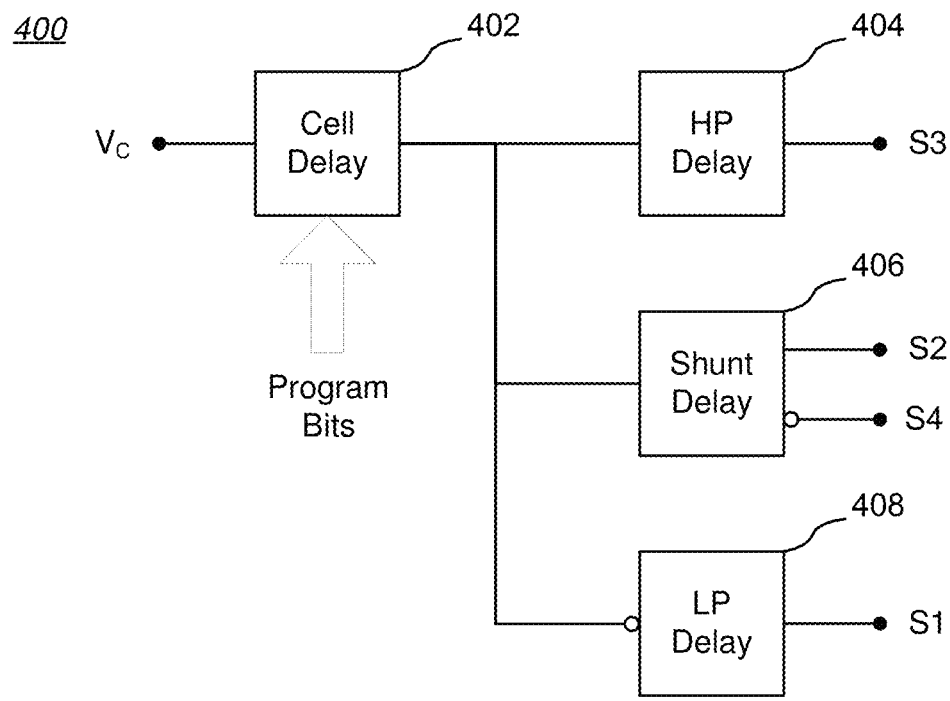
FIG. 4A is a block diagram of one control signal generation circuit that may be used to generate the control signals shown in FIG. 3.

FIG. 4A is a block diagram of one control signal generation circuit 400 that may be used to generate the control signals shown in FIG. 3. In the illustrated embodiment, a cell delay circuit 402 is configured to receive the master control signal $V_C$. The cell delay circuit 402 provides a selectable amount of delay after a state change for $V_C$ (low to high, or high to low) before passing on the applied state change. The output of the cell delay circuit 402 is coupled to an HP delay circuit 404 (which generates control signal S3), to a shunt delay circuit 406 (which generates complementary control signals S2 and S4), and through an inverting input to an LP delay circuit 408 (which generates control signal S1).

In the illustrated embodiment, the HP delay circuit 404 and the LP delay circuit 408 are state dependent, meaning that a delay is generated when the input to those circuits transitions from low to high, and no delay is generated when the input to those circuits transitions from high to low. For example, during a transition from +45° to 0°, and then from 0° degree to −45°, the transition for $V_C$ is from high to low, making the inverted $V_C$ input to the LP delay circuit 408 transition from low to high; the LP delay circuit 408 output will therefore be delayed. Conversely, the $V_C$ input to the HP delay circuit 404 transitions from high to low; the HP delay circuit 404 will therefore not be delayed.

Figure 4B:
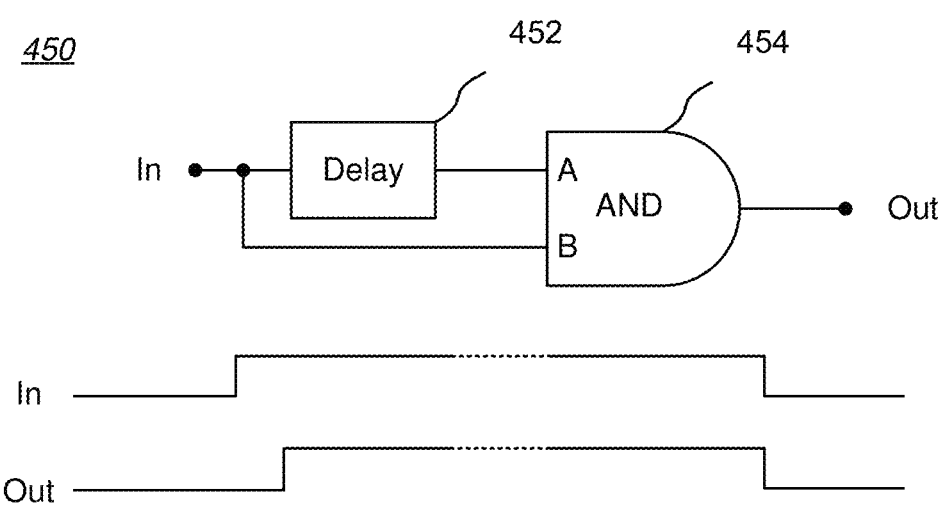
FIG. 4B is a block diagram and associated timing diagram of one embodiment of a state dependent delay circuit.

FIG. 4B is a block diagram and associated timing diagram of one embodiment of a state dependent delay circuit 450. A low-to-high signal applied at the In port to a conventional delay circuit 452 will be delayed for a selected amount of time and then propagated through to the A input of an AND gate 454. The B input to the AND gate 454 is the non-delayed low-to-high signal. Only after the delay imposed by the delay circuit 452 will the A and B inputs to the AND gate 454 be high, and thus the output of the AND gate 454 will be a delayed replica of the low-to-high signal. Conversely, if a high-to-low signal is applied at the In port, the B input to the AND gate 454 will be instantly low regardless of the operation of the delay circuit 452, and thus the output of the AND gate 454 will be a non-delayed replica of the high-to-low signal. The timing diagram in FIG. 4B reflects the state dependent delay behavior of the circuit 450. Of course, the opposite behavior, delaying only high-to-low input signals, may be achieved by inverting the signal applied to the In port.

The delay circuits shown in FIG. 4A and FIG. 4B may be implemented as conventional analog, digital, or hybrid analog/digital circuits, and may be edge or level triggered. Not shown in FIG. 4A or FIG. 4B are buffer circuits that may be coupled to the output of one or more delay circuits 402-210 for current driving, isolation, and/or other purposes.

For all of the delay circuits shown in FIG. 4A, the amount of delay may be fixed at the time of manufacture (such as by application of one or more mask layers or "blowing" fusible links), or set under program control that supplies one or more Program Bits to select a delay period (for example, as shown in FIG. 4A for the cell delay circuit 402). Such Program Bits may be provided from look-up tables external or internal to an integrated circuit that includes the control signal generation circuit 400, or by externally supplied control signals supplied, for example, through dedicated pins or through a bus interface (such as the well-known Serial Peripheral Interface bus or one of the interfaces specified by the Mobile Industry Processor Interface Alliance), or by any other convenient means. In some embodiments, some of the delay circuits shown in FIG. 4A or FIG. 4B may have a delay time fixed at the time of manufacture, while others of the delay circuits may have a programmable delay time. For example, it may be useful to make the delay time of the cell delay circuit 402 programmable, but have fixed delay times for the other delay circuits 404-408.

Figure 5A:
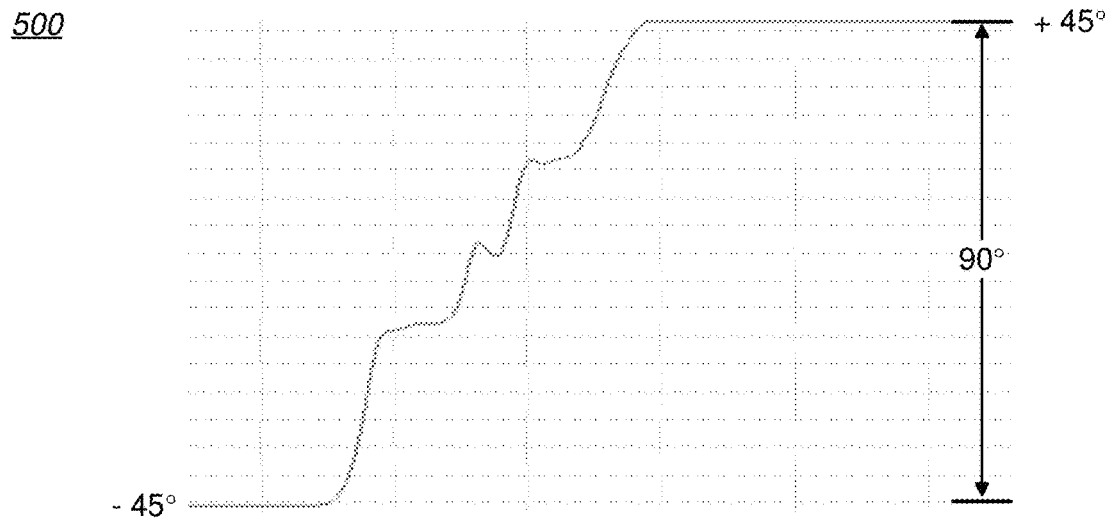
FIG. 5A is a graph of monotonic phase transition behavior for a simulation of one embodiment of a phase shifter cell 100 switched in accordance with the control signals shown in FIG. 3.
Figure 5B:
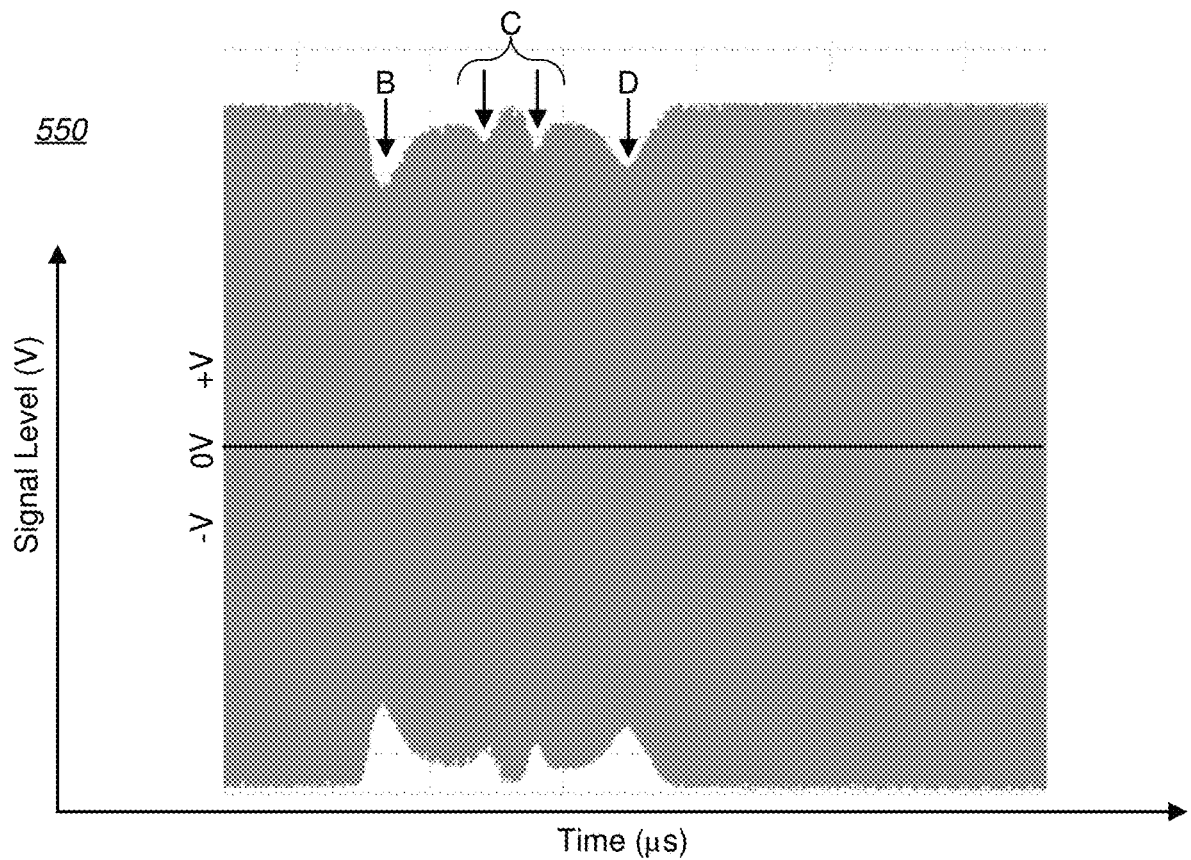
FIG. 5B is a graph of amplitude glitches versus time for a simulation of one embodiment of a phase shifter cell switched in accordance with the control signals shown in FIG. 3.

The effect of controlling switch transitions within a phase shifter cell in accordance with the present invention has striking advantages. For example, FIG. 5A is a graph 500 of monotonic phase transition behavior for a simulation of one embodiment of a phase shifter cell 100 switched in accordance with the control signals shown in FIG. 3. FIG. 5B is a graph 550 of amplitude glitches versus time for a simulation of one embodiment of a phase shifter cell 100 switched in accordance with the control signals shown in FIG. 3. In this particular example, a transition is made from a low pass state (−45° phase shift) to a high pass state (+45° phase shift). In the illustrated embodiment, a first glitch event at time "B" corresponds to the state change of the series reactance element switch M1 under the control of S1. A second glitch event at time "C" corresponds to the switching of the shunt switches M2, M4 under the control of S2 and S4, respectively; the switch state changes and settling time for their respective shunt circuits may not occur at exactly the same time, hence the spacing that may occur between corresponding glitches. A third glitch event at time "D" corresponds to the state change of the series reactance element switches M3 under the control of S3. The reverse transition from a high pass state (+45° phase shift) to a low pass state (−45° phase shift) would look similar, but with the switching of M1-M4—and hence the glitch order and monotonic phase transition behavior—reversed.

Figure 5C:
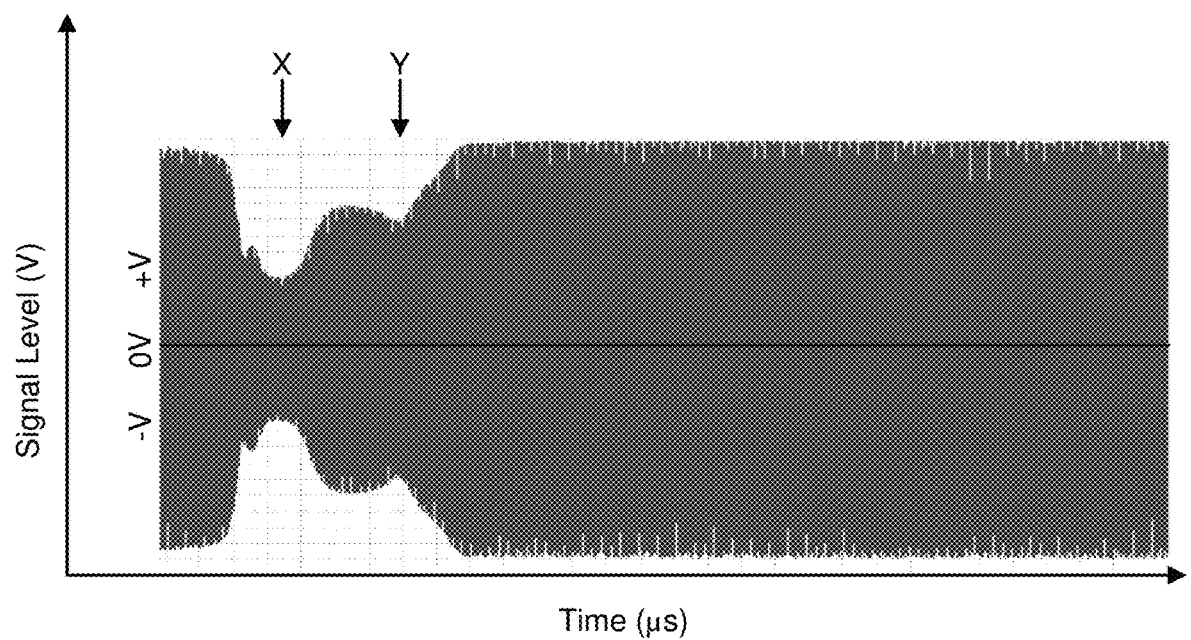
FIG. 5C is a graph of amplitude glitches versus time for a simulation of a prior art embodiment of a concurrently-switched phase shifter cell.

The graph 500 of FIG. 5A illustrates that the phase transition behavior of a phase shifter cell 100 switched in accordance with the control signals shown in FIG. 3 is essentially monotonic with state changes. As illustrated in FIG. 5B, spacing the transition states of the switches M1-M4 and transitioning from a "high pass state" to a "through-path state" and then to a "low pass state" (or vice versa) results in spacing out the glitches caused by each individual reactance state change. In the simulated embodiment, the amplitude of the largest glitch was about −2.4 dB. This is in contrast to the prior art, where switching of all of the switches M1-M4 at essentially the same time, or even random switch timing, would result in a much larger glitch in amplitude. For example, FIG. 5C is a graph 560 of amplitude glitches versus time for a simulation of a prior art embodiment of a concurrently-switched phase shifter cell. Concurrent switching of all switches M1-M4 for the same simulated embodiment exhibited maximum amplitude glitch as high as about 10 dB at time "X" (a secondary glitch at time "Y" results because, even with a "concurrent" switching control signal, individual transistors may have different switch response times). The phase glitch also can be excessive, and in one model of a prior art configuration was as much as 300° of positive glitch.

Note that the timing of switching for switches M2 and M4 can be controlled more exactly as needed—coincident, separated, or overlapped—but was not necessary in this example in light of inherent differences in the respective switch and signal response time. However, more exact control of the timing of switching of M2 and M4 may be important if the associated shunt reactances may interact in an adverse manner (see further discussion below).

Switched Reactance Dynamic Through-Path Phase Shifter Cell

In the switched reactance step-wise through-path phase shifter cell embodiment described above, there is a distinct transition to a through-path state when transitioning from a "high pass state" to a "low pass state", and vice versa. However, in the more general case, glitch reduction within a phase shifter cell can be achieved by controlling the phase shifter cell in such a way that the reactance elements do not all switch at the same time. More specifically, the sum of the shunt reactances and the series reactances is minimized as the corresponding phase shifter cell switches change state. Thus, instead of two phase states and a distinct through state, the sequencing times of the switches within a phase shifter cell (including phase shifter cells more complex than those shown in FIG. 1) can be dynamically and concurrently controlled to comply with the following operational rule set when transitioning from a "high pass state" to a "low pass state", and vice versa:

the sum of the series reactances (exact or normalized) is kept progressing monotonically while transitioning;

the sum of the shunt reactances (exact or normalized) is kept progressing monotonically (but in the opposite direction from the series reactances) while transitioning; and the sum of the normalized series (x/Zo) and shunt reactances (Zo/x) is minimized (i.e., made as close to zero as reasonably needed for a particular application).

Note that reversing the first two steps above results in similar behavior: the sum of the shunt reactances (exact or normalized) is kept progressing monotonically while transitioning, then the sum of the series reactances (exact or normalized) is kept progressing monotonically (but in the opposite direction from the shunt reactances) while transitioning.

In embodiments of such a phase shifter cell, the series and shunt switches (e.g., S1-S4 in FIG. 1) are calibrated such that they may be dynamically and concurrently controlled to comply with the operational rule set above. Thus, the LPF circuit 102 is not completely bypassed before the HPF circuit 104 is switched into circuit when transitioning from the low pass state to the high pass state, and vice versa. However, by complying with the above operational rule set (or a version with the first two steps reversed in order), a "through-path" can be essentially created dynamically, since the sum of the normalized series and shunt reactances is minimized. Such a dynamic "through-path" would correspond to transition state 5 in FIG. 5D.

Figure 5D:
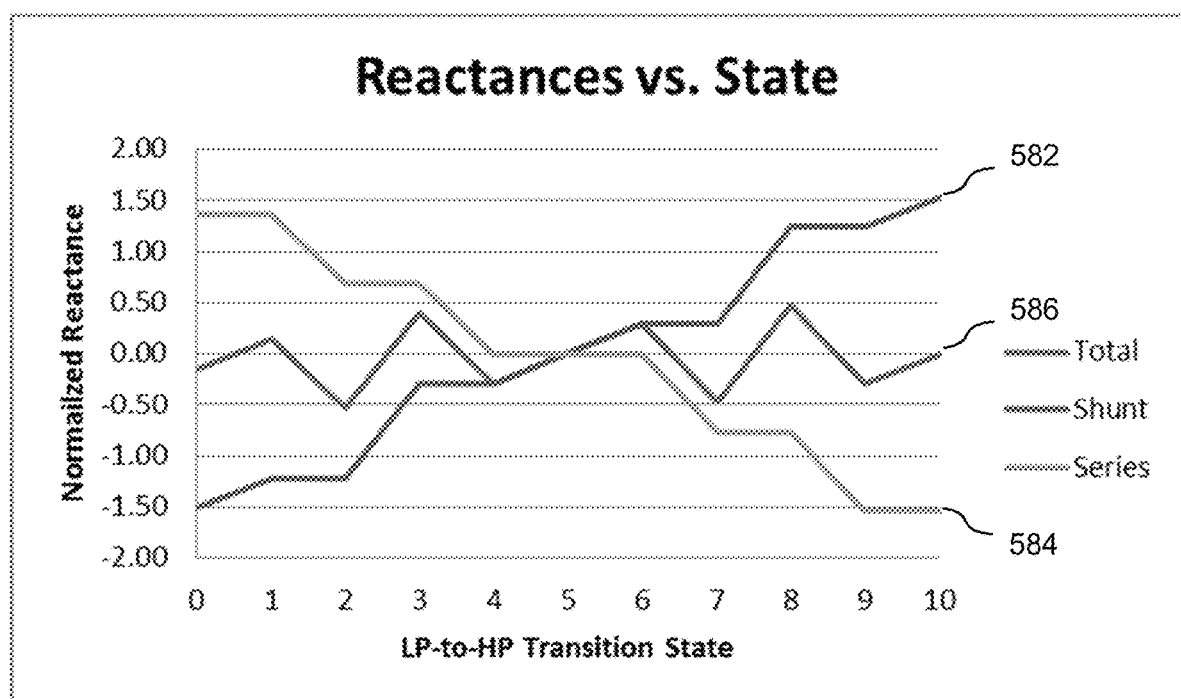
FIG. 5D is a graph of monotonic phase transition behavior for a simulation of one embodiment of a phase shifter cell having dynamically switched reactances.

FIG. 5D is a graph 580 of monotonic phase transition behavior for a simulation of one embodiment of a phase shifter cell 100 having dynamically switched reactances. Graph line 582 shows that the sum of the series reactances (normalized) is controlled so as to monotonically increase while transitioning from a low pass state to a high pass state. Graph line 584 shows that the sum of the shunt reactances (normalized) is controlled so as to monotonically decrease while transitioning from the low pass state to the high pass state. Graph line 586 shows that the sum of the normalized series (x/Zo) and shunt reactances (Zo/x) is controlled so as to be approximately zero. The opposite transition, from the high pass state to the low pass state, will exhibit similar but opposite behavior (e.g., similar to reading the graph 580 from right-to-left, instead of left-to-right).

The result of using a switched reactance dynamic through-path phase shifter cell is that, in either transition direction, the phase transition is monotonic with state, the return loss and insertion loss are kept nearly uniform across all states, and the signal vector rotates during the transition. By assuring that the return loss, and most importantly, the insertion loss, are kept nearly uniform during the phase state transition, the amplitude of the signal remains unchanged, and thus the phase shifter cell behaves more ideally, having an impact essentially only on phase. Minimizing the impact on signal amplitude will assure elements downstream from the phase shifter cell will see the same power level. For example, this will assure that a downstream amplifier sees a more constant signal level rather than large dips in power level which could trigger an instability or transient from which the signal chain would then need to recover.

Switched Reactance Multi-State Phase Shifter Cell

Figure 6A:
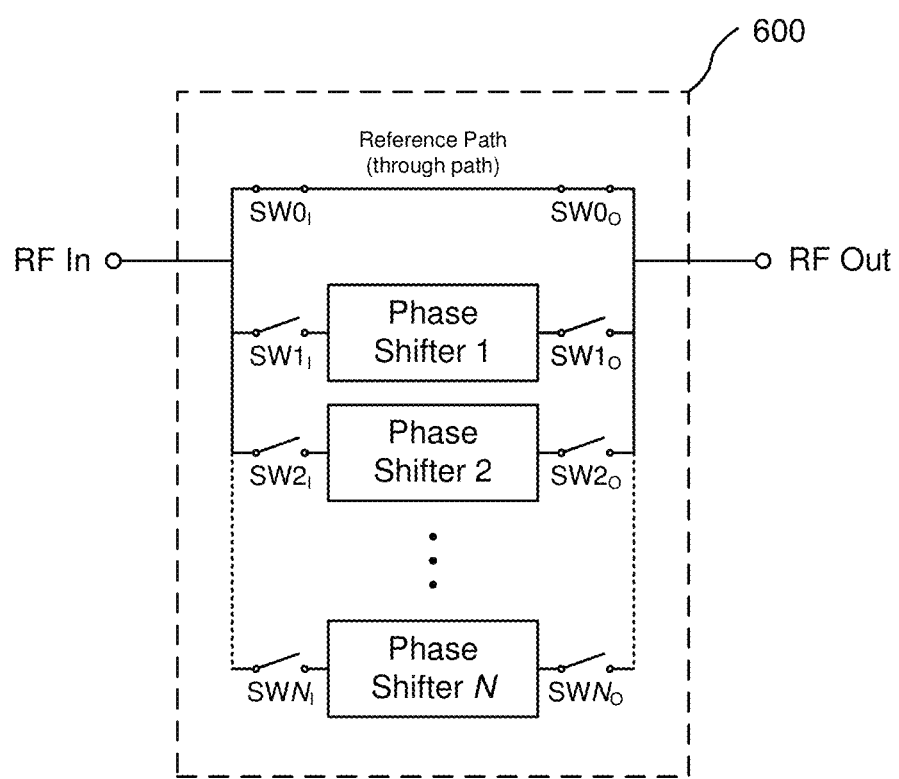
FIGS. 6A-6C are block diagrams of a multi-state phase shifter cell in three different switch states.
Figure 6B:
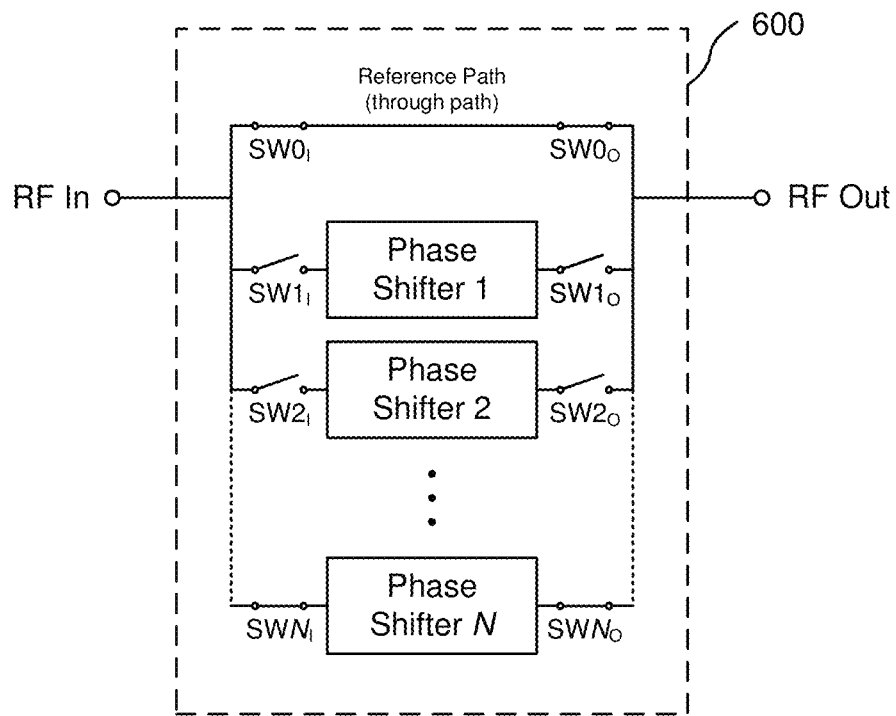
Figure 6C:
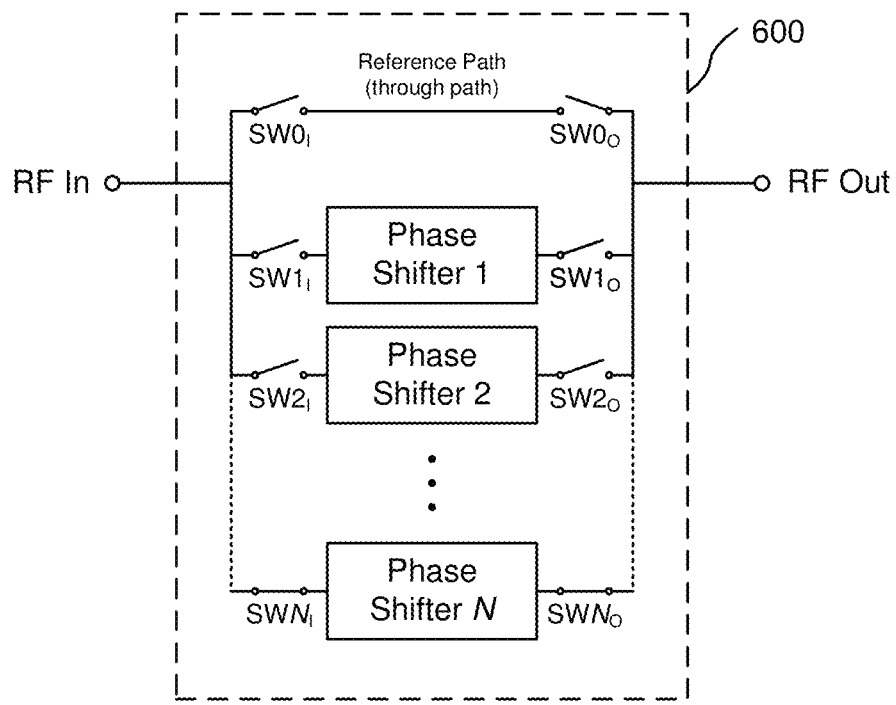

Some phase shifter cells may be capable of providing a selectable amount of phase shift. One such "multi-state" phase shifter cell is described in U.S. patent application Ser. No. 15/017,433, filed on Feb. 5, 2016, entitled "Low Loss Multi-State Phase Shifter". For example, FIGS. 6A-6C are block diagrams of a multi-state phase shifter cell 600 in three different switch states. Referring to FIG. 6A, an RF signal may be coupled to an RF In port to an RF Out port through one or more signal paths. The signal paths may include a Reference Path (i.e., a "through path" with a phase shift of essentially 0°) and/or one or more of N Phase Shifters. In some embodiments, the Reference Path may be omitted, in which case some non-zero amount of phase shift will always be imposed on an applied signal.

A signal path from the RF In port to the RF Out port is selected by concurrently switching associated switch pairs SWx$_I$, SWx$_O$ (more compactly, SWx$_{I,O}$) under the control of a control circuit (not shown). Each signal path has a signal conduction (active) state when the associated switch pairs SWx$_{I,O}$ are closed, and has a signal blocking (inactive) state when the associated switch pairs SWx$_{I,O}$ are open. The switch pairs may be implemented as field-effect transistors (FETs) or any suitable switch technology. In the state shown in FIG. 6A, switch pairs SW0$_{I,O}$ are closed, and thus the RF In port is coupled to the RF Out port through the Reference Path.

One aspect of the present invention to reduce or avoid state-change glitches uses a "make before break" timing scheme for multi-state phase shifter cells such as the type shown in FIGS. 6A-6C. In the case of phase shifter cells having phase shifters all of the same polarity (a "Type 1" configuration, such as 0°, +11.25°, +22.5°, and +33.75°, or −33.75°, −22.5°, −11.25°, and 0°) or which are not directly switched from one polarity to the opposite polarity (a "Type 2" configuration, such as −11.25°, 0°, +11.25°, and +22.5°, or −45°, 0°, +45°, and +90°), as a first step in transitioning from one phase state to another, a next signal path is first switched into series connection between the RF In port and the RF Out port so as to become active, while the previous signal path remains active—that is, for a period of time, both signal paths are connected between the RF In port and the RF Out port. Thereafter, the previous signal path is switched out of series connection between the RF In port and the RF Out port, thus becoming inactive.

For example, with the starting signal path state shown in FIG. 6A for a Type 1 configuration, the RF In port is coupled to the RF Out port through the Reference Path. If the next signal path is to be Phase Shifter N, then associated switch pairs SWN$_{I,O}$ are closed while switch pairs SW0$_{I,O}$ remain closed, as shown in FIG. 6B. Thus, momentarily, the RF In port is coupled to the RF Out port through both the Reference Path and Phase Shifter N. Thereafter, switch pairs SW0$_{I,O}$ are opened, as shown in FIG. 6C, and the RF In port is coupled to the RF Out port through only Phase Shifter N. This "make before break" or "delayed inactivation" timing scheme may be implemented by opening and closing the associated switches SWx$_{I,O}$ as shown in TABLE 2 (bolding indicates a change in switch state).

TABLE 2

|  | Starting Signal Path: Reference Path (Switches SW0$_{I, O}$) | Ending Signal Path: Phase Shifter N (Switches SWN$_{I, O}$) |
| --- | --- | --- |
| Initial State | CLOSED | OPEN |
| 1$^{st}$ transition | CLOSED | CLOSED |
| 2$^{nd}$ transition | OPEN | CLOSED |

Similarly, if the next signal path after Phase Shifter N is to be Phase Shifter 1, then associated switch pairs SW1$_{I,O}$ are closed while switch pairs SWN$_{I,O}$ remain closed. Thereafter, switch pairs SWN$_{I,O}$ are opened. Accordingly, in both examples, the process "makes" a next signal path before the process "breaks" the previous signal path. A Type 2 configuration utilizes the same timing scheme as a Type 1 configuration, with the added constraint that signal paths are not directly switched from one polarity phase shifter to an opposite polarity phase shifter.

In a variation, an improved way to have a smooth transition of phase for Type 1 and 2 configurations of a multi-state phase shifter cell 600 is to transition between all the intermediate phase states in a "step-wise" manner. For example, for a multi-state phase shifter cell 600 having signal paths providing −45°, 0°, +45°, and +90° of phase shift (i.e., a Type 2 configuration), a three-step transition may be used to switch from the −45° state to the +90° state. The phase shifter cell 600 will use the "make before break" timing scheme described above to switch from the −45° state to the 0° state, then switch from the 0° state to the +45° state, and finally switch from the +45° state to the +90° state. The several smaller phase transitions from the initial phase state to the final phase state change will take a longer time to happen compared to directly switching from the initial phase state to the final phase state, but the amplitude of state-change glitches will be significantly reduced. More particularly, when two of the signal paths are connected between the RF In port and the RF Out port, the phase difference of the combined signal at the RF Out port is much lower (only 45° in this example), reducing signal cancellation at the output. In contrast, moving directly from the −45° state to the +90° state using "make before break" will cause the combining signal at the output to be 135° out of phase, increasing cancellation and in turn increasing the glitch amplitude.

Figure 6D:
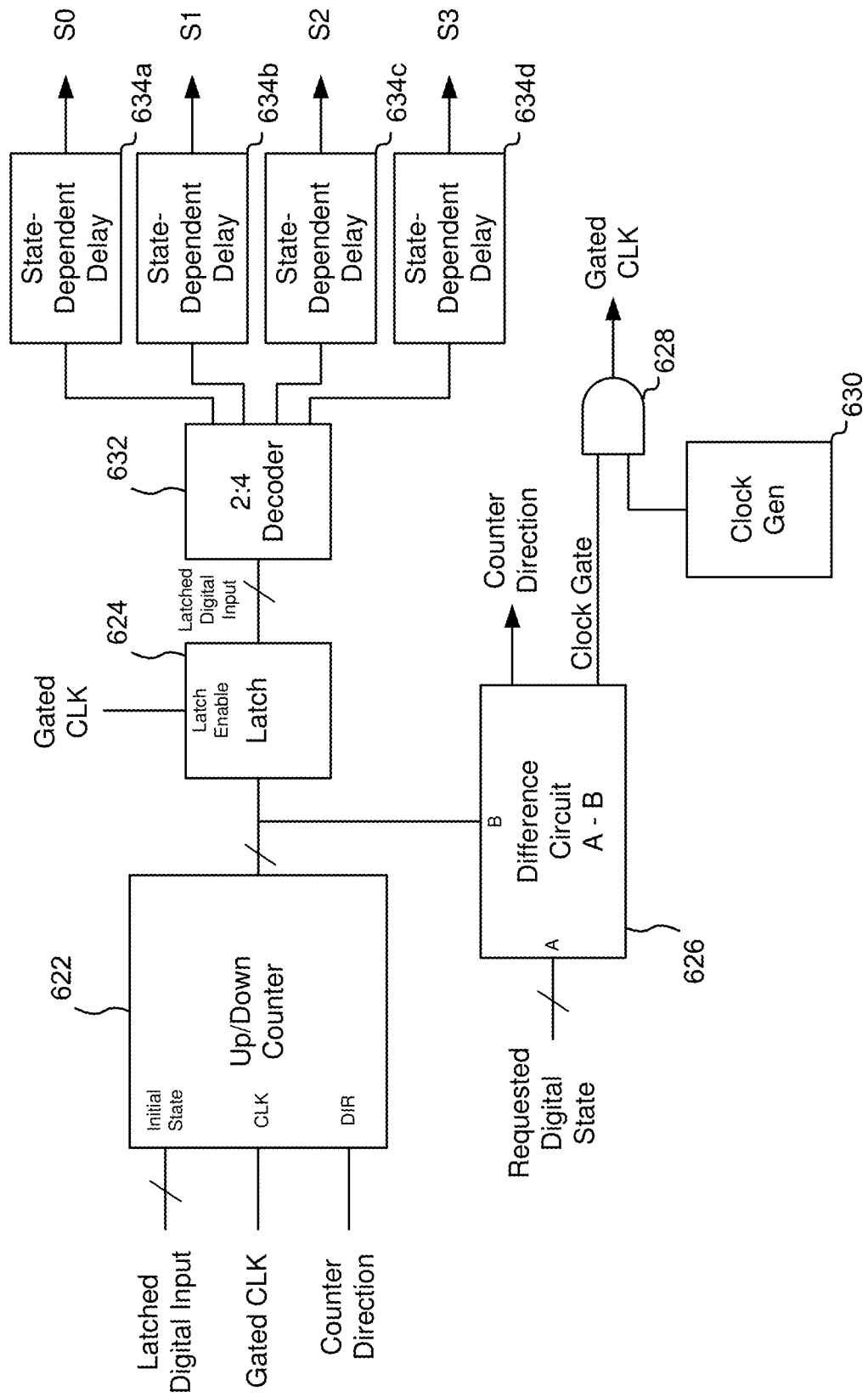
FIG. 6D is a block diagram of one embodiment of a timing control circuit that may be used to control a multi-state phase shifter cell having four signal paths in a Type 1 or Type 2 configuration, controlled by control signals S0-S3, respectively.

A timing control circuit for implementing such a "step-wise" timing scheme may be readily implemented using a look-up table or an up/down counter to control the sequence of switch activations/deactivations needed to change from an initial phase shift state to a final selected phase state in a "step-wise" fashion. For example, FIG. 6D is a block diagram of one embodiment of a timing control circuit 620 that may be used to control a multi-state phase shifter cell 600 having four signal paths in a Type 1 or Type 2 configuration, controlled by control signals S0-S3, respectively. The previous digital state of the multi-state phase shifter cell 600—the Latched Digital Input—is provided to the Initial State input of an Up/Down Counter 622, and is used to set the counter to count from the initial phase state to the final requested phase state. The output of the Up/Down Counter 622 is coupled to a Latch 624 and to one input of a Difference Circuit 626. Coupled to a second input of the Difference Circuit 626 is a final Requested Digital State. The difference (negative or positive) between the previous phase state and the final phase state, output by the Difference Circuit 626 as a Counter Direction signal, will decide the counting direction of the Up/Down Counter 622.

As the Up/Down Counter 622 counts, the difference computed by the Difference Circuit 626 diminishes. Once the A and B inputs are the same, a Clock Gate signal from the Difference Circuit 626 to an AND gate 628 goes low and stops the output of a Clock Generator 630 from reaching the Up/Down Counter 622 as the Gated CLK signal, thus stopping counting.

The Gated CLK signal is also used to control the Latch 624. When the Gated CLK signal is low, the last count from the Up/Down Counter 622 is captured as the Latched Digital Input. When the Gated CLK signal is high, the Latch 624 is just a "through pass" gate and couples the count output of the Up/Down Counter 622 to a 2:4 Decoder 632, which selectively activates a set of State Dependent Delay circuits 634a-634d, which in turn output control signals S0-S3. The states of control signals S0-S3 change in a sequential (but overlapping) order as determined by the Initial State input, the Requested Digital State, and the Counter Direction of the Up/Down Counter 622. For example, if the Initial State input is the binary code for the phase state controlled by S1, and the Requested Digital State is the binary code for the phase state controlled by S3, then the Up/Down Counter 622 will count from binary "10" to "11". The corresponding State Dependent Delay circuits 634c-634d will output S2 and S3 in a "make before break" overlapping sequence to connect corresponding phase shifter signal paths between the RF In port and the RF Out port.

In the case of a multi-state phase shifter cell 600 with Phase Shifters of opposite polarities in which signal paths may be switched from one polarity phase shifter to a phase shifter of opposite polarity (e.g., Phase Shifter N may provide a +90° phase shift, while Phase Shifter 1 may provide a −90° phase shift—a "Type 3" configuration), a slightly different "make before break" timing scheme may be used to avoid glitches and to maintain a monotonic switching order. In this case, the teachings of FIG. 3 may be combined with the teachings of FIGS. 6A-6B, requiring a transition to an intermediate "through-path state" when transitioning from one polarity phase shifter state to an opposite polarity phase shifter state. Without a transition to an intermediate "through-path state", if a multi-state phase shifter cell 600 transitions from −X degree to +X degree using a "make before break" timing scheme, total cancellation may happen at the output as the signals from the two path will be out of phase.

For example, assume a starting signal path state as shown in FIG. 6C, with Phase Shifter N series-coupled between the RF In port and the RF Out port and providing a phase shift of +X°. Further assume that the next signal path state is to be with Shifter 1 series-coupled between the RF In port and the RF Out port and providing a phase shift of −X°. The "make before break with intermediate through-path stage" timing scheme may be implemented by opening and closing the associated switches SWx$_{I,O}$ as shown in TABLE 3 (bolding indicates a change in switch state).

TABLE 3

| | Starting Signal Path (+Phase Shifter N) (Switches SWN$_{I, O}$) | Reference Path (through path) (Switches SW0$_{I, O}$) | Ending Signal Path (−Phase Shifter 1) (Switches SW1$_{I, O}$) |
|---|---|---|---|
| Initial State | CLOSED | OPEN | OPEN |
| 1$^{st}$ transition | CLOSED | CLOSED | OPEN |
| 2$^{nd}$ transition | OPEN | CLOSED | OPEN |
| 3$^{rd}$ transition | OPEN | CLOSED | CLOSED |
| 4$^{th}$ transition | OPEN | OPEN | CLOSED |

In a variation of the timing scheme of Table 3, the 2$^{nd}$ and 3$^{rd}$ transitions can be done concurrently, since the reference path is active and provides a shorted signal path from the RF In port to the RF Out port. Such a timing scheme may be implemented by opening and closing the associated switches SWx$_{I,O}$ as shown in TABLE 4 (bolding indicates a change in switch state).

TABLE 4

| | Starting Signal Path (+Phase Shifter N) (Switches SWN$_{I, O}$) | Reference Path (through path) (Switches SW0$_{I, O}$) | Ending Signal Path (−Phase Shifter 1) (Switches SW1$_{I, O}$) |
|---|---|---|---|
| Initial State | CLOSED | OPEN | OPEN |
| 1$^{st}$ transition | CLOSED | CLOSED | OPEN |
| 2$^{nd}$ transition | OPEN | CLOSED | CLOSED |
| 3$^{rd}$ transition | OPEN | OPEN | CLOSED |

Without the "make before break" timing schemes described above, there may be a moment in time when the signal paths from the RF In port to the RF Out port may be disconnected, causing a phase and/or amplitude glitch at the RF Out port. Note that the "make before break with intermediate through-path stage" timing scheme for a Type 3 configuration of a multi-state phase shifter cell 600 generally should not be used for Type 1 or Type 2 configurations, since transitioning to a 0° state in between switching from two positive or two negative phase states will generally cause a phase glitch.

Circuitry for implementing the "make before break" or "delayed inactivation" logic described above, including the "step-wise make before break" variation, may be readily implemented by one of ordinary skill in the art using combinatorial logic or a look-up table to implement the switching patterns shown in any of TABLES 2-4. Such a circuit may advantageously be implemented in part using state dependent delay circuits of the type shown in FIG. 4B. In practice, such logic circuitry should be present after a conventional cell selection decoder circuit, since transistor gate signals need to be delayed rather than the digital selection signal applied to the decoder circuit.

Figure 6E:
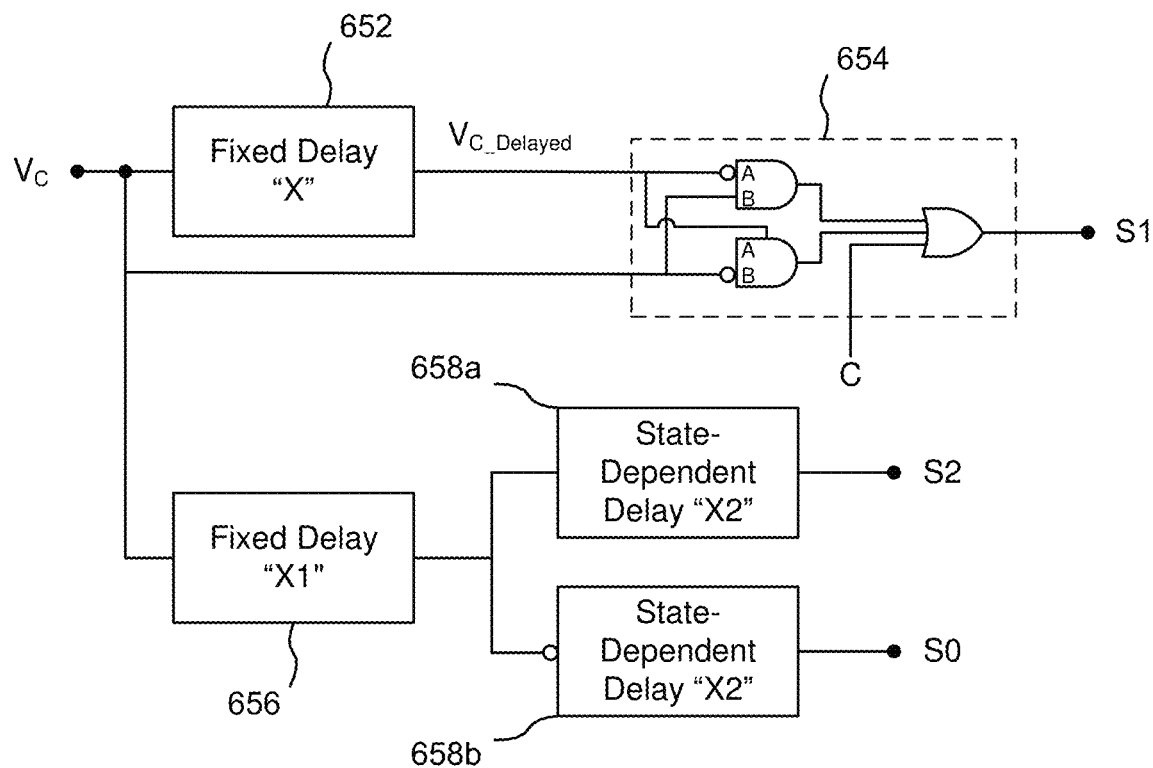
FIG. 6E is a block diagram of one embodiment of a timing control circuit that may be used to control a multi-state phase shifter cell having three signal paths in a Type 3 configuration (e.g., −90°, 0°, and +90° phase shifters), controlled by control signals S0-S2, respectively.

For example, FIG. 6E is a block diagram of one embodiment of a timing control circuit 650 that may be used to control a multi-state phase shifter cell 600 having three signal paths in a Type 3 configuration (e.g., −90°, 0°, and +90° phase shifters), controlled by control signals S0-S2, respectively. The timing control circuit 650 will generate a short time window (time window of length "X") in which the reference signal path is turned ON by a control signal S1. More specifically, a phase shift control signal $V_C$ is coupled to a fixed delay circuit 652 which outputs a delayed version, $V_{C\_Delayed}$, of $V_C$ after a selected delay time of "X". A reference path control signal logic circuit 654 receives $V_C$ and $V_{C\_Delayed}$ and outputs control signal S1 for the reference signal path of the example multi-state phase shifter cell 600 (i.e., 0° phase shift). In this example, S1 can also independently controlled by a separate control signal C, if desired; if not used, C is set to a logic low. The phase shift control signal $V_C$ is also coupled to a fixed delay circuit 656 which outputs a delayed version of $V_C$ after a delay time of "X1"; that output is coupled to complementary state dependent delay circuits 658a, 658b, which output control signals S2 and S0, respectively, after a delay time of "X2". In this example, the state dependent delay circuits 658a, 658b generate a delay only when the output of the fixed delay circuit 656 goes "high to low", but otherwise may be similar to the circuit shown in FIG. 4B. The small delay "X1" is added to make sure that the S0 and S2 control signals do not change state before S1 is turned ON. In general, the delay time "X" should be set to be greater than delay times X1+X2.

Multiple Coupled Phase Shifter Cells

Another aspect of the present invention to reduce or avoid phase state-change glitches encompasses arranging the timing of each phase shifter cell (or "bit") in a set of multiple coupled phase shifter cells such that the individual cells do not all switch (either ON or OFF) at the same time.

Figure 7:
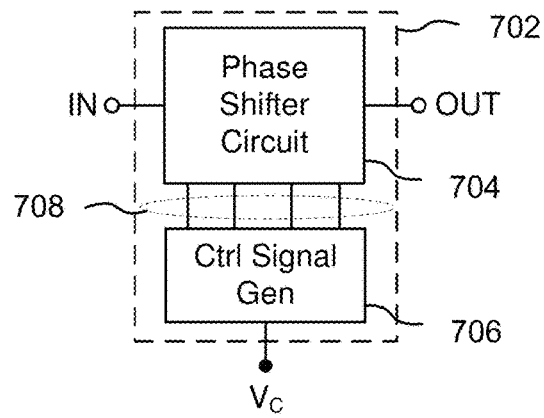
FIG. 7 is block diagram of an enhanced phase shifter cell that incorporates a control signal generation circuit.

FIG. 7 is block diagram of an enhanced phase shifter cell 702 that incorporates a control signal generation circuit. The enhanced phase shifter cell 702 includes a phase shifter circuit 704, which may be similar to the phase shifter cells shown in FIG. 1 or FIG. 6A, and a control signal generation circuit 706, which may be similar to the circuit of FIG. 4A or a circuit implementing the logic of TABLES 2-4 above. A master control signal $V_C$ from a control circuit (not shown) sets a phase shift state for the enhanced phase shifter cell 702, and the control signal generation circuit 706 provides a set of suitably delayed signals (shown encircled by dashed oval 708) to the phase shifter circuit 704, as described above. The control signal generation circuit 706 may impose an optional delay on the action of the master control signal $V_C$, as described above with respect to the cell delay circuit 402 of FIG. 4A. The control signal generation circuit 706 may also include "make before break" functionality described above with respect to multi-state phase shifter cells.

Figure 8:
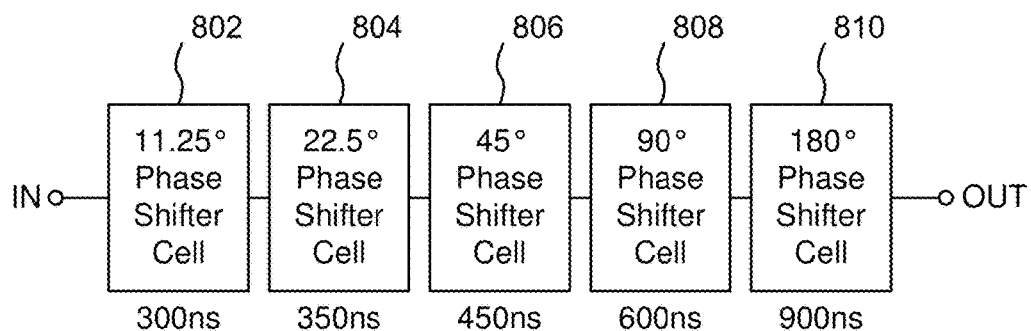
FIG. 8 is a block diagram of a first embodiment of multiple coupled phase shifter cells that provide a selectable amount of phase shift to an applied signal.

FIG. 8 is a block diagram of a first embodiment of multiple coupled phase shifter cells that provide a selectable amount of phase shift to an applied signal. In this example, five phase shifter cells 802-810 each provide a different amount of selectable phase shift, varying from 11.25° to 180°, to a signal applied at an IN port (note that the order of the phase shifter cells 802-810 may be varied from the order shown). Each phase shifter cell 802-810 may be similar to the enhanced phase shifter cell 702 shown in FIG. 7, but with different component values to provide the indicated amount of phase shift (control signal connections are omitted for clarity). This particular embodiment is binary coded, such that a 5-bit command word provided by control circuitry (not shown) can select any one of 32 combinations of the phase shifter cells 802-810 (from all bypassed to all active). In other embodiments, thermometer coding, hybrid binary/thermometer coding, or other coding schemes may be used.

In the embodiment shown in FIG. 8, each phase shifter cell 802-810 may be operated in accordance with the timing scheme shown in FIG. 3, to reduce glitches per cell. Further, a control signal generation circuit 400, 706 of the types respectively shown in FIG. 4A and FIG. 7 may be advantageously used to alter the timing of glitches generated by each phase shifter cell 802-810. For example, a cell delay circuit 402 for each phase shifter cell 802-810 may be configured with differing amounts of delay per cell, as indicated in FIG. 8 (i.e., phase shifter cell 802 has 300 ns of cell delay provided by a cell delay circuit 402, while phase shifter cell 810 has 900 ns of cell delay).

The amount of delay for activation of each phase shifter cell 802-810 may be determined by simulation or measurement of sample circuits, and may differ due to different settling times for each phase shifter cell; generally, cells providing larger degrees of phase shift require larger settling times. In general, each phase shifter cell will have a switching delay time distinct from the switching delay time of at least one other phase shifter cell so as to mitigate transients arising from selection of a phase shift state.

Figure 9:
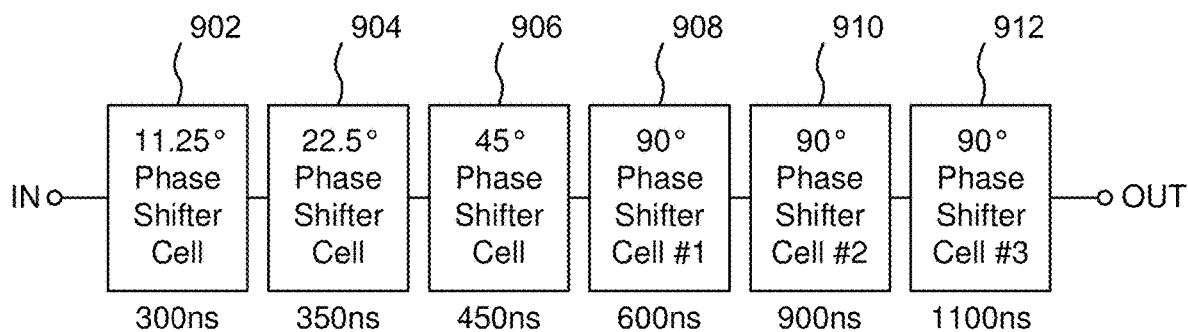
FIG. 9 is a block diagram of a second embodiment of multiple coupled phase shifter cells that provide a selectable amount of phase shift to an applied signal.

FIG. 9 is a block diagram of a second embodiment of multiple coupled phase shifter cells that provide a selectable amount of phase shift to an applied signal. In this example, six phase shifter cells 902-912 each provide a distinct amount of selectable phase shift, varying from 11.25° to 90°, to a signal applied at an IN port. Again, each phase shifter cell 902-912 may be similar to the enhanced phase shifter cell 702 shown in FIG. 7, but with different component values to provide the indicated amount of phase shift. Again, a cell delay circuit 402 for each phase shifter cell 902-912 may be configured with differing amounts of delay per cell, as indicated in FIG. 9.

The embodiment in FIG. 9 uses two 90° phase shifter cells 910, 912 in place of the single 180° phase shifter cell 810 of FIG. 8. A 90° phase shifter cell typically produces less of a glitch than a 180° phase shifter cell. This embodiment may be binary coded (treating the last two phase shifter cells 910, 912 as one unit, but activating the cells at slight offset times to reduce per cell glitches), thermometer coded, hybrid binary/thermometer coded, or coded with some other scheme. As with the embodiment of FIG. 8, the amount of delay for activation of each phase shifter cell 902-912 may be determined by simulation or measurement of sample circuits.

Figure 10A:
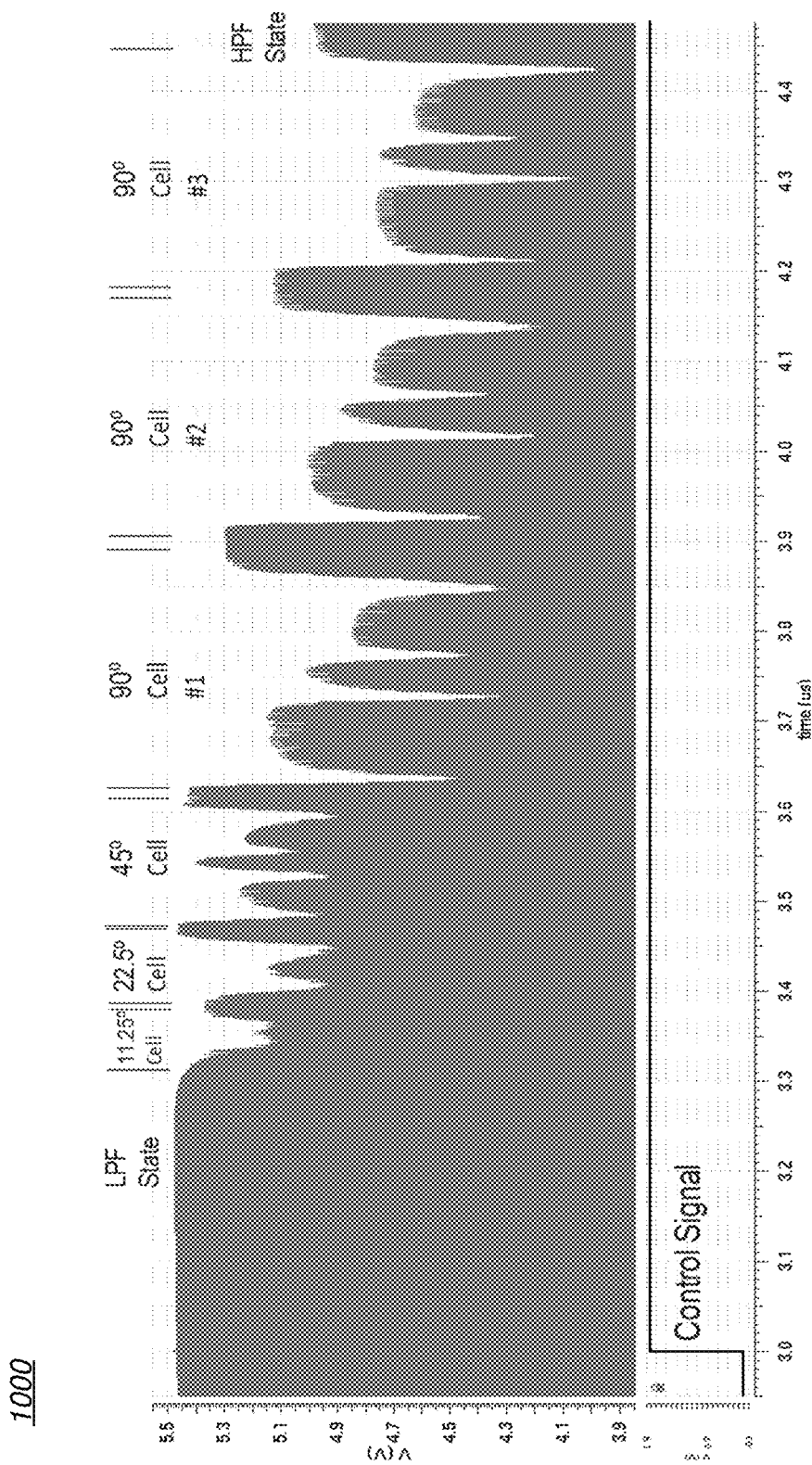
FIG. 10A is a graph of amplitude glitches versus time for a simulation of the multiple coupled phase shifter cells shown in FIG. 9, for a worst-case scenario.
Figure 10B:
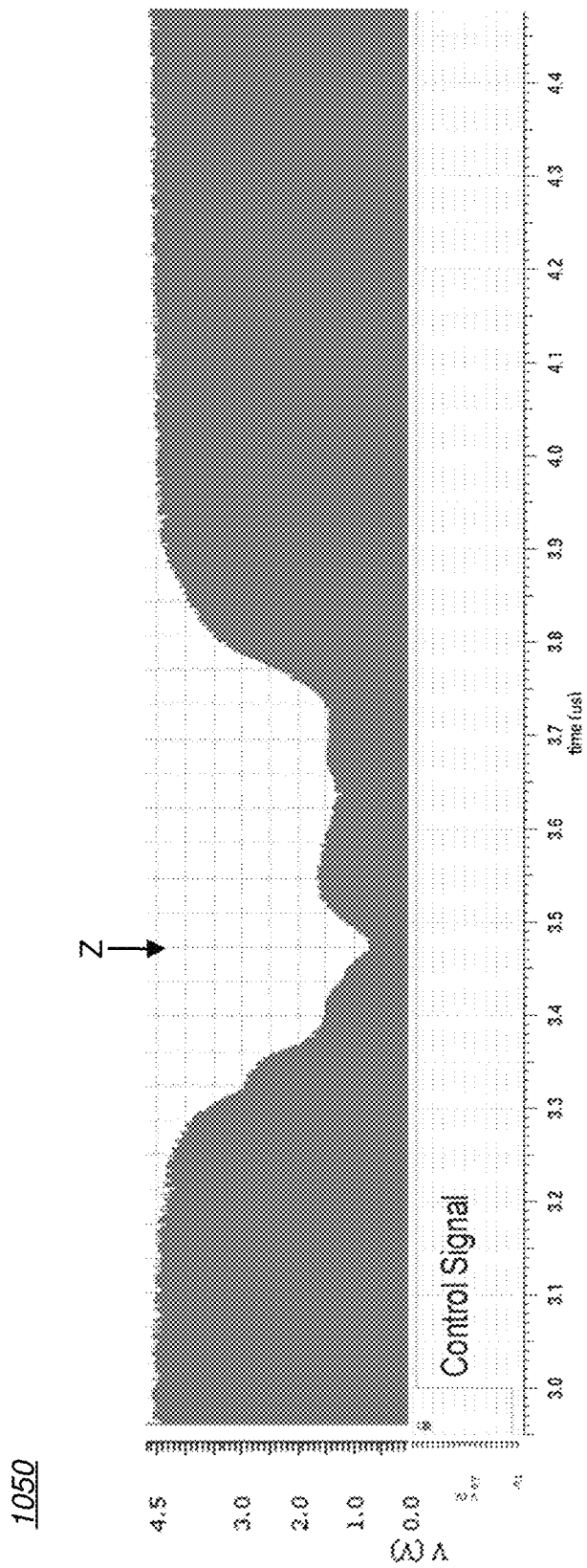
FIG. 10B is a graph of amplitude glitches versus time for a simulation of multiple coupled prior art phase shifter cells concurrently switched in a worst-case scenario.

FIG. 10A is a graph 1000 of amplitude glitches versus time for a simulation of the multiple coupled phase shifter cells shown in FIG. 9, for a worst-case scenario. In this example, showing a transition from a low-pass filter (LPF) state to a high-pass filter (HPF) state, when a Control Signal (bottom of graph) changes state, each of the six phase shifter cells 902-912 in FIG. 9 changes state. However, due to the action of the cell delay circuit 402 of each phase shifter cell 902-912, the actual switching time for each cell is offset from each other cell as determined by the delay times indicated in FIG. 9. As can be seen from the graph 900, spacing out phase shifter cell switching times to prevent all cells from switching at the same moment in time spreads out the glitch events associated with each state transition. This is in contrast to the prior art, where concurrent switching of all of the phase shifter cell 902-912 would result in a much larger glitch in amplitude occurring at essentially the same time. For example, FIG. 10B is a graph 1050 of amplitude glitches versus time for a simulation of multiple coupled prior art phase shifter cells concurrently switched in a worst-case scenario (note that the vertical dimension has been compressed compared to FIG. 10A). In one model, with concurrent switching, the maximum glitch was about 16 dB at time "Z", taking into account that all phase shifter cells do not have the same switch response time and so do not really produce their respective glitches at exactly the same moment in time (hence the spread of switching transient glitches around time "Z"); if all the phase shifter cells did change state at the same time, then the maximum glitch would be even greater with the prior art configuration.

Methods

Figure 11:
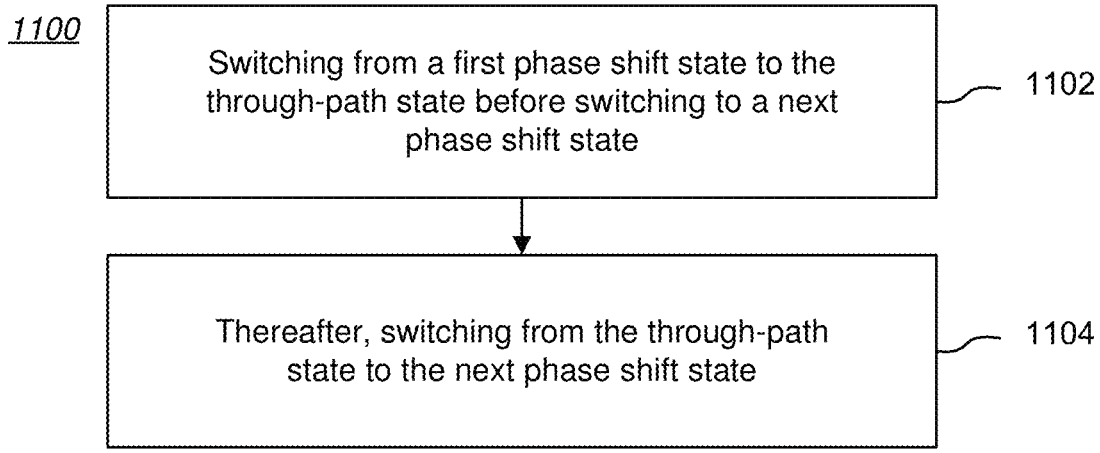
FIG. 11 is a process chart showing a method for mitigating signal transients arising from phase state changes in a phase shifter cell having at least two phase shift states and a through-path state.

Another aspect of the invention includes methods for mitigating signal transients arising from phase state changes. For example, FIG. 11 is a process chart 1100 showing a method for mitigating signal transients arising from phase state changes in a phase shifter cell having at least two phase shift states and a through-path state, including: switching from a first phase shift state to the through-path state before switching to a next phase shift state (STEP 1102); and thereafter switching from the through-path state to the next phase shift state (STEP 1104).

Figure 12:
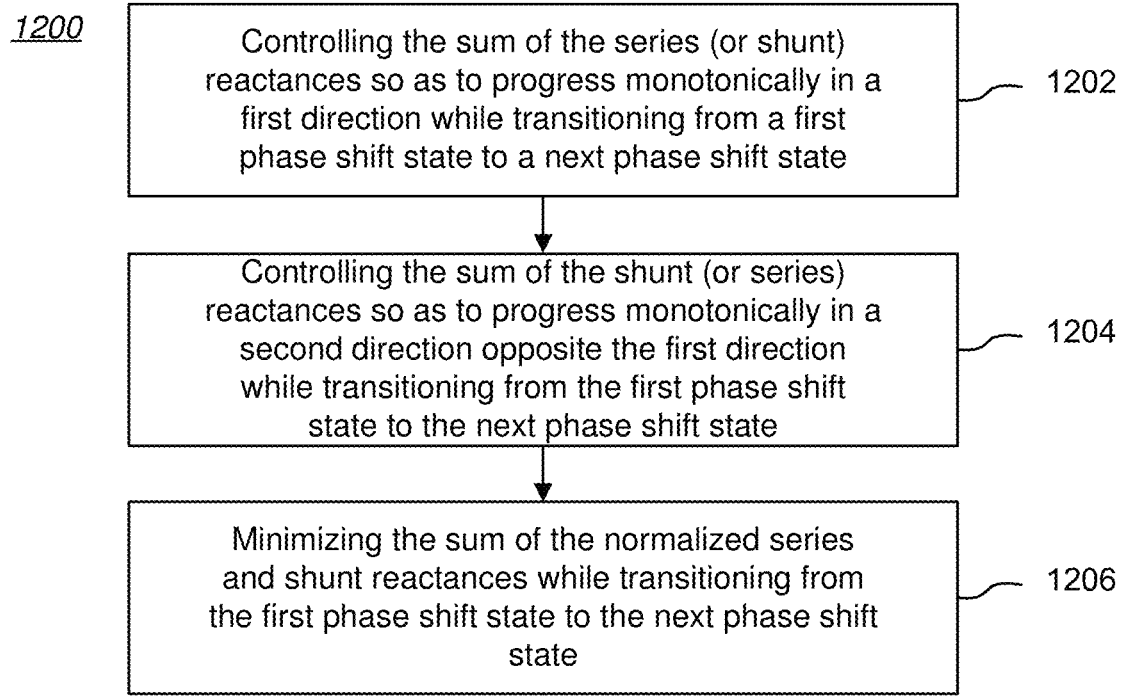
FIG. 12 is a process chart showing a method for mitigating signal transients arising from phase state changes in a phase shifter cell having at least two phase shift states defined by two or more series reactances and two or more shunt reactances.

As another example, FIG. 12 is a process chart 1200 showing a method for mitigating signal transients arising from phase state changes in a phase shifter cell having at least two phase shift states defined by two or more series reactances and two or more shunt reactances, including: controlling the sum of the series (or shunt) reactances so as to progress monotonically in a first direction while transitioning from a first phase shift state to a next phase shift state (STEP 1202); controlling the sum of the shunt (or series) reactances so as to progress monotonically in a second direction opposite the first direction while transitioning from the first phase shift state to the next phase shift state (STEP 1204); and minimizing the sum of the normalized series and shunt reactances while transitioning from the first phase shift state to the next phase shift state (STEP 1206). As should be clear, STEPS 1202 and 1204 can be performed in either order.

Figure 13:
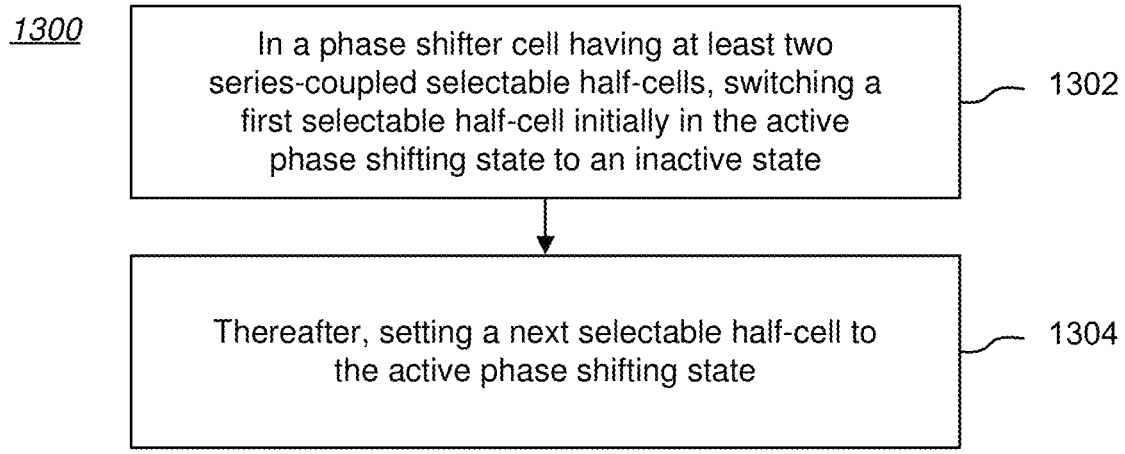
FIG. 13 is a process chart showing a method for mitigating signal transients arising from phase state changes in a phase shifter cell having at least two series-coupled selectable half-cells, each selectable half-cell having an active phase shifting state and an inactive decoupled state.

As another example, FIG. 13 is a process chart 1300 showing a method for mitigating signal transients arising from phase state changes in a phase shifter cell having at least two series-coupled selectable half-cells, each selectable half-cell having an active phase shifting state and an inactive decoupled state, including: switching a first selectable half-cell initially in the active phase shifting state to an inactive state (STEP 1302); thereafter, setting a next selectable half-cell to the active phase shifting state (STEP 1304).

Figure 14:
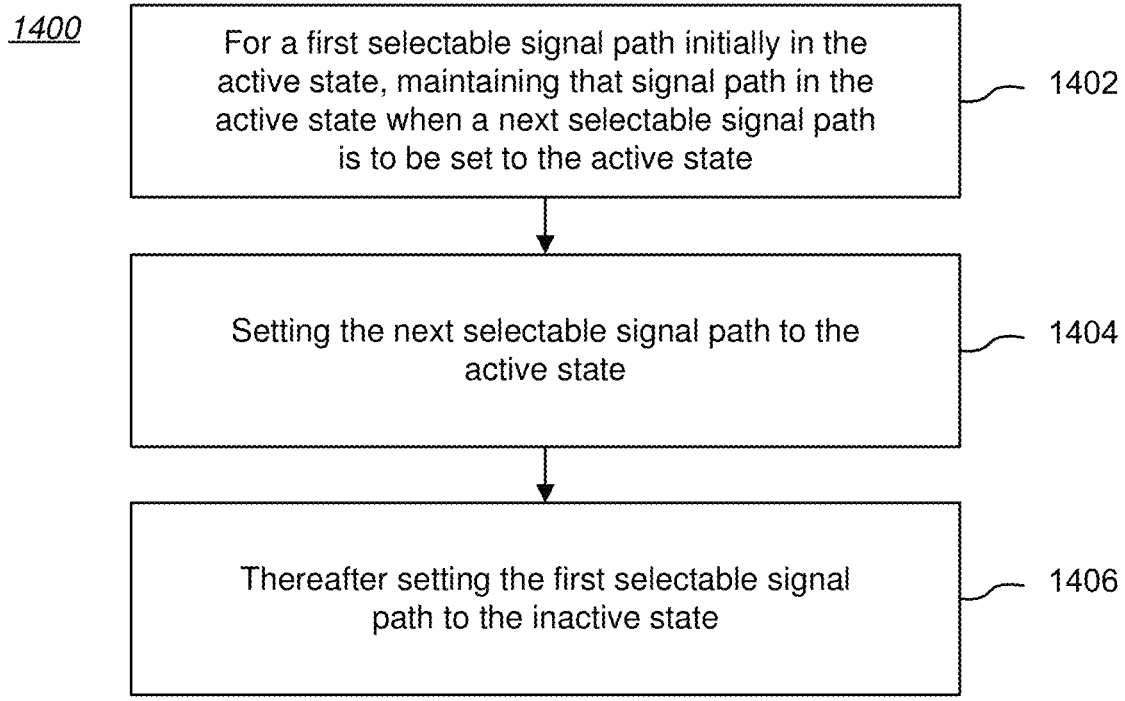
FIG. 14 is a process chart showing a method for mitigating signal transients arising from phase state changes in a phase shifter cell including at least two selectable signal paths, each selectable signal path having an active state and an inactive state.

As yet another example, FIG. 14 is a process chart 1400 showing a method for mitigating signal transients arising from phase state changes in a phase shifter cell including at least two selectable signal paths, each selectable signal path having an active state and an inactive state, including: for a first selectable signal path that is initially in the active state, maintaining that signal path in the active state when a next selectable signal path is to be set to the active state (STEP 1402); setting the next selectable signal path to the active state (STEP 1404); and thereafter setting the first selectable signal path to the inactive state (STEP 1406).

Figure 15:
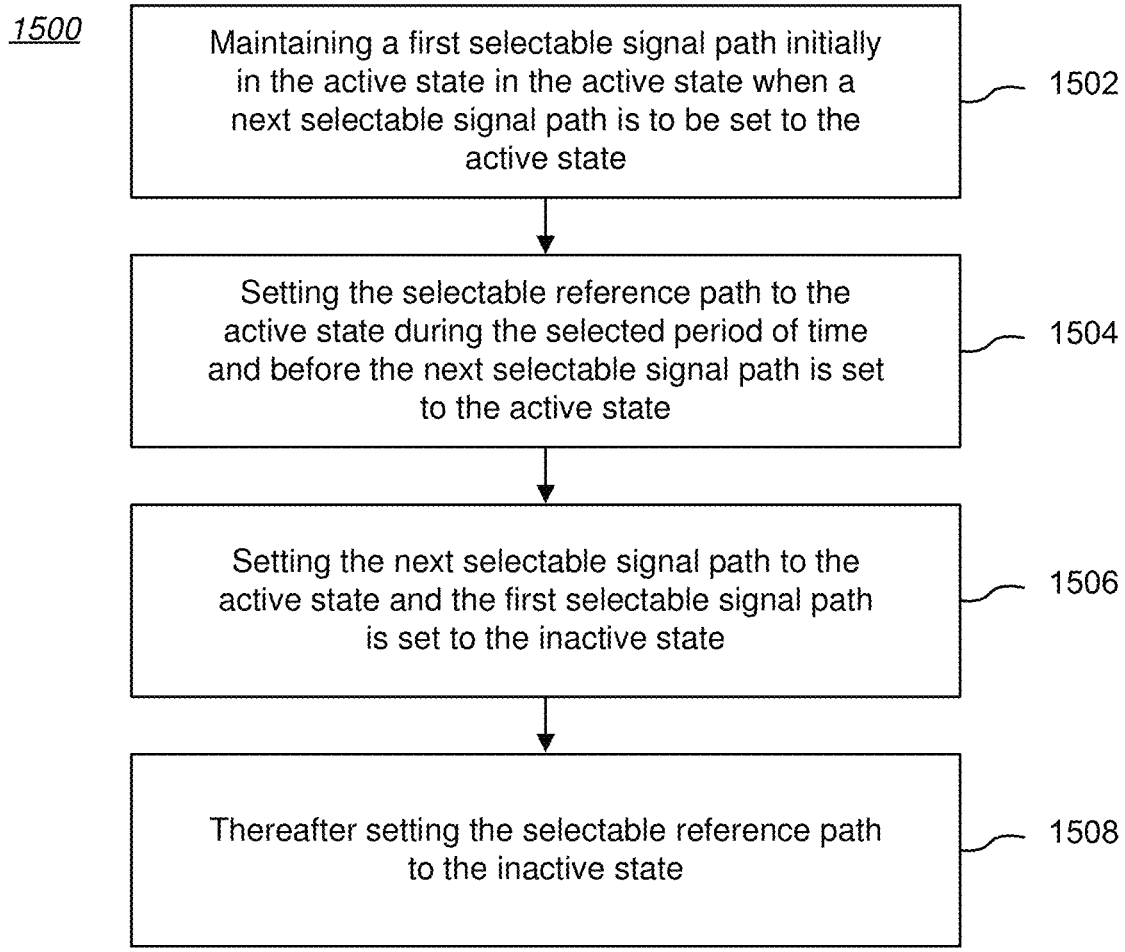
FIG. 15 is a process chart showing a method for mitigating signal transients arising from phase state changes in a phase shifter cell including at least two selectable signal paths and a selectable reference path, each selectable signal path having an active state and an inactive state.

FIG. 15 is a process chart 1500 showing a method for mitigating signal transients arising from phase state changes in a phase shifter cell including at least two selectable signal paths and a selectable reference path, each selectable signal path and the selectable reference path having an active state and an inactive state, including: maintaining a first selectable signal path initially in the active state in the active state when a next selectable signal path is to be set to the active state (STEP 1502); setting the selectable reference path to the active state during the selected period of time and before the next selectable signal path is set to the active state (STEP 1504); setting the next selectable signal path to the active state and the first selectable signal path is set to the inactive state (STEP 1506); and thereafter setting the selectable reference path to the inactive state (STEP 1508).

Figure 16:
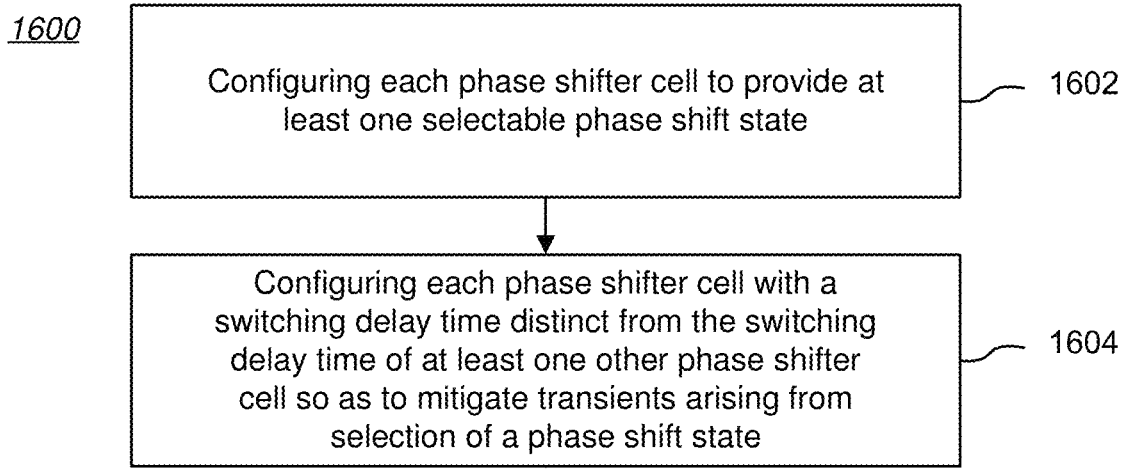
FIG. 16 is a process chart showing a method for mitigating signal transients arising from phase state changes in a plurality of series-coupled phase shifter cells.

FIG. 16 is a process chart 1600 showing a method for mitigating signal transients arising from phase state changes in a plurality of series-coupled phase shifter cells, including: configuring each phase shifter cell to provide at least one selectable phase shift state (STEP 1602); and configuring each phase shifter cell with a switching delay time distinct from the switching delay time of at least one other phase shifter cell so as to mitigate transients arising from selection of a phase shift state (STEP 1604).

The methods described above may further include steps based on the teachings of this disclosure, such as providing a control signal generation circuit configured to delay generating time-delayed control signals for a selectable period time, or wherein the first selectable signal path has an opposite phase shift polarity with respect to the next selectable signal path.

Fabrication Technologies and Options

Some embodiments that include phase shifter circuits of the types described above may also include a digitally controlled RF signal attenuator circuit that provides a discrete set of attenuation states that are selected by a binary control word, directly or after decoding. In some applications, it may be beneficial or even necessary to independently control switching of component shunt reactances within a phase shifter cell (e.g., shunt capacitors $C_{LPF}$ and shunt inductor $L_{HPF}$ shown in FIG. 1). For example, in the timing diagram shown in FIG. 3, S2 and S4 are sequenced virtually together, in a complementary fashion. From a math perspective, if the two reactances $C_{LPF}$, $L_{HPF}$ controlled by corresponding switches M2 and M4 are sized per ideal LPF/HPF values, then their switching can be concurrent or sequential—being in parallel, the combined reactance of $C_{LPF}$ and $L_{HPF}$ is infinite in the ideal case. However, in reality, each reactance $C_{LPF}$, $L_{HPF}$ has some finite loss, so to minimize total loss, it generally would be beneficial to disconnect one of the reactances before connecting the other reactance. Accordingly, some embodiments may separate the sequencing times for S2 and S4. Such independent control is also generally useful in implementing phase shifter cells having dynamic switched reactance through-paths.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A plurality of series-coupled phase shifter cells each providing at least one selectable phase shift state for an applied radio frequency signal, wherein at least one phase shifter cell of the plurality of series-coupled phase shifter cells includes (1) a first half-cell including at least two reactance elements and configured to provide a first phase shifting state for the applied radio frequency signal or a non-phase shifting through-path state, and (2) a second half-cell including at least two reactance elements and configured to provide a second phase shifting state for the applied radio frequency signal or a non-phase shifting through-path state;

wherein when the at least one phase shifter cell transitions from the first phase shifting state to the second phase shifting state, the first half-cell and the second half-cell of the at least one phase shifter cell are set to respective non-phase shifting through-path states between transitions from the first phase shifting state to the second phase shifting state;

wherein at least one phase shifter cell has a first switching delay time before commencement of transitions from the first phase shifting state to the second phase shifting state distinct from a second switching delay time before commencement of transitions from the first phase shifting state to the second phase shifting state of at least one other phase shifter cell of the plurality of series-coupled phase shifter cells; and wherein when the at least one phase shifter cell transitions from the first phase shifting state to the second phase shift state, the at least one phase shifter cell progresses essentially monotonically through multiple intermediate phase values.

2. The plurality of series-coupled phase shifter cells of claim 1, wherein at least two phase shifter cells of the plurality of series-coupled phase shifter cells provide approximately the same selectable phase shift state but have distinct switching delay times.

3. The plurality of series-coupled phase shifter cells of claim 1, wherein at least three phase shifter cells of the plurality of series-coupled phase shifter cells provide approximately the same selectable phase shift state but have distinct switching delay times.

4. The plurality of series-coupled phase shifter cells of claim 1, further including a control signal generation circuit coupled to at least one phase shifter cell of the plurality of series-coupled phase shifter cells and configured to be coupled to a master control signal, the control signal generation circuit configured to generate a sequence of time-delayed control signals for the coupled at least one phase shifter cell in response to the master control signal such that between transitions from the first phase shifting state to the second phase shifting state, the first half-cell and the second half-cell of the at least one phase shifter cell coupled to the control signal generation circuit are set to respective non-phase shifting through-path states.

5. The plurality of series-coupled phase shifter cells of claim 4, wherein the control signal generation circuit is configured to delay generating the time-delayed control signals for a selectable period time.

6. The plurality of series-coupled phase shifter cells of claim 1, wherein at least one phase shifter cell of the plurality of phase shifter cells includes at least two selectable signal paths, each selectable signal path having an active state and an inactive state, wherein a first selectable signal path initially in the active state remains in the active state for a selected period of time when a next selectable signal path is set to the active state, and thereafter the first selectable signal path is set to the inactive state.

7. The plurality of series-coupled phase shifter cells of claim 6, further including a control signal generation circuit coupled to the selectable signal paths of the at least one phase shifter cell, and configured to be coupled to a master control signal, for generating a sequence of time-delayed control signals for the coupled selectable signal paths such that during transitions from the first selectable signal path initially in the active state to the next selectable signal path initially in the inactive state, the first selectable signal path remains in the active state for a selected period of time while the next selectable signal path is set to the active state, and thereafter the first selectable signal path is set to the inactive state.

8. The plurality of series-coupled phase shifter cells of claim 1, wherein at least one phase shifter cell of the plurality of phase shifter cells includes at least two selectable signal paths and a selectable reference path, each selectable signal path and the selectable reference path having an active state and an inactive state, wherein:
  (a) a first selectable signal path initially in the active state remains in the active state for a selected period of time when a next selectable signal path is to be set to the active state;
  (b) the selectable reference path is set to the active state during the selected period of time and before the next selectable signal path is set to the active state;
  (c) the next selectable signal path is set to the active state and the first selectable signal path is set to the inactive state; and
  (d) thereafter the selectable reference path is set to the inactive state.

9. The plurality of series-coupled phase shifter cells of claim 8, further including a control signal generation circuit coupled to the selectable signal paths and the selectable reference path of the at least one phase shifter cell, and configured to be coupled to a master control signal, for generating a sequence of time-delayed control signals for the coupled selectable signal paths and selectable reference path such that during transitions from the first selectable signal path initially in the active state to the next selectable signal path initially in the inactive state, the first selectable signal path remains in the active state for a selected period of time while the selectable reference path is set to the active state, and thereafter the next selectable signal path is set to the active state and the first selectable signal path is set to the inactive state, and thereafter the selectable reference path is set to the inactive state.

10. The plurality of series-coupled phase shifter cells of claim 8, wherein the first selectable signal path has an opposite phase shift polarity with respect to the next selectable signal path.

11. A phase shifting circuit, including:
  (a) a first phase shifter cell configured to provide at least a first selectable phase shifting state for an applied radio frequency analog signal, a second selectable phase shifting state for the applied radio frequency analog signal, and a first through-path state for the applied radio frequency analog signal, the first phase shifter cell having a first switching delay time before commencement of transitions from the first selectable phase shifting state to the second selectable phase shifting state, wherein during transitions from the first selectable phase shifting state to the second selectable phase shifting state, the first phase shifter cell is set to the first through-path state before being set to the second selectable phase shifting state; and
  (b) a second phase shifter cell coupled in series with the first phase shifter cell and configured to provide a third selectable phase shifting state for the applied radio frequency analog signal, the second phase shifter cell having a second switching delay time before commencement of the third selectable phase shifting state;
    wherein the first switching delay time is distinct from the second switching delay time; and
    wherein when the at least one phase shifter cell transitions from the first phase shifting state to the second phase shift state, the at least one phase shifter cell progresses essentially monotonically through multiple intermediate phase values.

12. The phase shifting circuit of claim 11, wherein the second phase shifter cell is configured to provide a fourth selectable phase shifting state for the applied radio frequency analog signal and a second through-path state, wherein during transitions from the third selectable phase shifting state to the fourth selectable phase shifting state, the second phase shifter cell is set to the second through-path state before being set to the fourth selectable phase shifting state.

13. A plurality of series-coupled phase shifter cells each providing at least one selectable phase shift state for an applied radio frequency signal, wherein at least one phase shifter cell of the plurality of series-coupled phase shifter cells includes (1) a first half-cell including at least two reactance elements and configured to provide a first phase shifting state for the applied radio frequency signal or a non-phase shifting through-path state, and (2) a second half-cell including at least two reactance elements and configured to provide a second phase shifting state for the applied radio frequency signal or a non-phase shifting through-path state;
  wherein when the at least one phase shifter cell transitions from the first phase shifting state to the second phase shifting state, the first half-cell and the second half-cell of the at least one phase shifter cell are set to respective non-phase shifting through-path states between transitions from the first phase shifting state to the second phase shifting state;
  wherein at least one phase shifter cell has a first switching delay time before commencement of transitions from the first phase shifting state to the second phase shifting state distinct from a second switching delay time before commencement of transitions from the first phase shifting state to the second phase shifting state of at least one other phase shifter cell of the plurality of series-coupled phase shifter cells; and
  wherein when the at least one phase shifter cell transitions from the first phase shifting state to the second phase shift state, a phase transition behavior of the at least one phase shifter cell is essentially monotonic with state changes.

14. The plurality of series-coupled phase shifter cells of claim 13, wherein at least two phase shifter cells of the plurality of series-coupled phase shifter cells provide approximately the same selectable phase shift state but have distinct switching delay times.

15. The plurality of series-coupled phase shifter cells of claim 13, wherein at least three phase shifter cells of the plurality of series-coupled phase shifter cells provide approximately the same selectable phase shift state but have distinct switching delay times.

16. The plurality of series-coupled phase shifter cells of claim 13, further including a control signal generation circuit coupled to at least one phase shifter cell of the plurality of series-coupled phase shifter cells and configured to be coupled to a master control signal, the control signal generation circuit configured to generate a sequence of time-delayed control signals for the coupled at least one phase shifter cell in response to the master control signal such that between transitions from the first phase shifting state to the second phase shifting state, the first half-cell and the second half-cell of the at least one phase shifter cell coupled to the control signal generation circuit are set to respective non-phase shifting through-path states.

17. The plurality of series-coupled phase shifter cells of claim 16, wherein the control signal generation circuit is configured to delay generating the time-delayed control signals for a selectable period time.

18. The plurality of series-coupled phase shifter cells of claim 13, wherein at least one phase shifter cell of the plurality of phase shifter cells includes at least two selectable signal paths, each selectable signal path having an active state and an inactive state, wherein a first selectable signal path initially in the active state remains in the active state for a selected period of time when a next selectable signal path is set to the active state, and thereafter the first selectable signal path is set to the inactive state.

19. The plurality of series-coupled phase shifter cells of claim 18, further including a control signal generation circuit coupled to the selectable signal paths of the at least one phase shifter cell, and configured to be coupled to a master control signal, for generating a sequence of time-delayed control signals for the coupled selectable signal paths such that during transitions from the first selectable signal path initially in the active state to the next selectable signal path initially in the inactive state, the first selectable signal path remains in the active state for a selected period of time while the next selectable signal path is set to the active state, and thereafter the first selectable signal path is set to the inactive state.

20. The plurality of series-coupled phase shifter cells of claim 13, wherein at least one phase shifter cell of the plurality of phase shifter cells includes at least two selectable signal paths and a selectable reference path, each selectable signal path and the selectable reference path having an active state and an inactive state, wherein:
  (a) a first selectable signal path initially in the active state remains in the active state for a selected period of time when a next selectable signal path is to be set to the active state;
  (b) the selectable reference path is set to the active state during the selected period of time and before the next selectable signal path is set to the active state;
  (c) the next selectable signal path is set to the active state and the first selectable signal path is set to the inactive state; and
  (d) thereafter the selectable reference path is set to the inactive state.

21. The plurality of series-coupled phase shifter cells of claim 20, further including a control signal generation circuit coupled to the selectable signal paths and the selectable reference path of the at least one phase shifter cell, and configured to be coupled to a master control signal, for generating a sequence of time-delayed control signals for the coupled selectable signal paths and selectable reference path such that during transitions from the first selectable signal path initially in the active state to the next selectable signal path initially in the inactive state, the first selectable signal path remains in the active state for a selected period of time while the selectable reference path is set to the active state, and thereafter the next selectable signal path is set to the active state and the first selectable signal path is set to the inactive state, and thereafter the selectable reference path is set to the inactive state.

22. The plurality of series-coupled phase shifter cells of claim 20, wherein the first selectable signal path has an opposite phase shift polarity with respect to the next selectable signal path.

23. A plurality of series-coupled phase shifter cells each providing at least one selectable phase shift state for an applied radio frequency signal, wherein at least one phase shifter cell of the plurality of series-coupled phase shifter cells includes (1) a first half-cell including at least two reactance elements and configured to provide a first phase shifting state for the applied radio frequency signal or a non-phase shifting through-path state, and (2) a second half-cell including at least two reactance elements and configured to provide a second phase shifting state for the applied radio frequency signal or a non-phase shifting through-path state;
  wherein when the at least one phase shifter cell transitions from the first phase shifting state to the second phase shifting state, the first half-cell and the second half-cell of the at least one phase shifter cell are set to respective non-phase shifting through-path states between transitions from the first phase shifting state to the second phase shifting state;
  wherein at least one phase shifter cell has a first switching delay time before commencement of transitions from the first phase shifting state to the second phase shifting state distinct from a second switching delay time before commencement of transitions from the first phase shifting state to the second phase shifting state of at least one other phase shifter cell of the plurality of series-coupled phase shifter cells; and
  wherein the first and second phase shifting states of the at least one phase shifter cell are defined by two or more series reactances and two or more shunt reactances, and wherein during transitions from the first phase shifting state to the second phase shift state, the sum of the series reactances is controlled so as to progress monotonically in a first direction, the sum of the shunt reactances is controlled so as to progress monotonically in a second direction opposite the first direction, and the sum of the normalized series and shunt reactances is minimized.

24. The plurality of series-coupled phase shifter cells of claim 23, wherein at least two phase shifter cells of the plurality of series-coupled phase shifter cells provide approximately the same selectable phase shift state but have distinct switching delay times.

25. The plurality of series-coupled phase shifter cells of claim 23, wherein at least three phase shifter cells of the plurality of series-coupled phase shifter cells provide approximately the same selectable phase shift state but have distinct switching delay times.

26. The plurality of series-coupled phase shifter cells of claim 23, further including a control signal generation circuit coupled to at least one phase shifter cell of the plurality of series-coupled phase shifter cells and configured to be coupled to a master control signal, the control signal generation circuit configured to generate a sequence of time-delayed control signals for the coupled at least one phase shifter cell in response to the master control signal such that between transitions from the first phase shifting state to the second phase shifting state, the first half-cell and the second half-cell of the at least one phase shifter cell coupled to the control signal generation circuit are set to respective non-phase shifting through-path states.

27. The plurality of series-coupled phase shifter cells of claim 26, wherein the control signal generation circuit is configured to delay generating the time-delayed control signals for a selectable period time.

28. The plurality of series-coupled phase shifter cells of claim 23, wherein at least one phase shifter cell of the plurality of phase shifter cells includes at least two selectable signal paths, each selectable signal path having an active state and an inactive state, wherein a first selectable signal path initially in the active state remains in the active state for a selected period of time when a next selectable signal path is set to the active state, and thereafter the first selectable signal path is set to the inactive state.

29. The plurality of series-coupled phase shifter cells of claim 28, further including a control signal generation circuit coupled to the selectable signal paths of the at least one phase shifter cell, and configured to be coupled to a master control signal, for generating a sequence of time-delayed control signals for the coupled selectable signal paths such that during transitions from the first selectable signal path initially in the active state to the next selectable signal path initially in the inactive state, the first selectable signal path remains in the active state for a selected period of time while the next selectable signal path is set to the active state, and thereafter the first selectable signal path is set to the inactive state.

30. The plurality of series-coupled phase shifter cells of claim 23, wherein at least one phase shifter cell of the plurality of phase shifter cells includes at least two selectable signal paths and a selectable reference path, each selectable signal path and the selectable reference path having an active state and an inactive state, wherein:
(a) a first selectable signal path initially in the active state remains in the active state for a selected period of time when a next selectable signal path is to be set to the active state;
(b) the selectable reference path is set to the active state during the selected period of time and before the next selectable signal path is set to the active state;
(c) the next selectable signal path is set to the active state and the first selectable signal path is set to the inactive state; and
(d) thereafter the selectable reference path is set to the inactive state.

31. The plurality of series-coupled phase shifter cells of claim 30, further including a control signal generation circuit coupled to the selectable signal paths and the selectable reference path of the at least one phase shifter cell, and configured to be coupled to a master control signal, for generating a sequence of time-delayed control signals for the coupled selectable signal paths and selectable reference path such that during transitions from the first selectable signal path initially in the active state to the next selectable signal path initially in the inactive state, the first selectable signal path remains in the active state for a selected period of time while the selectable reference path is set to the active state, and thereafter the next selectable signal path is set to the active state and the first selectable signal path is set to the inactive state, and thereafter the selectable reference path is set to the inactive state.

32. The plurality of series-coupled phase shifter cells of claim 30, wherein the first selectable signal path has an opposite phase shift polarity with respect to the next selectable signal path.

33. A phase shifting circuit, including:
(a) a first phase shifter cell configured to provide at least a first selectable phase shifting state for an applied radio frequency analog signal, a second selectable phase shifting state for the applied radio frequency analog signal, and a first through-path state for the applied radio frequency analog signal, the first phase shifter cell having a first switching delay time before commencement of transitions from the first selectable phase shifting state to the second selectable phase shifting state, wherein during transitions from the first selectable phase shifting state to the second selectable phase shifting state, the first phase shifter cell is set to the first through-path state before being set to the second selectable phase shifting state; and
(b) a second phase shifter cell coupled in series with the first phase shifter cell and configured to provide a third selectable phase shifting state for the applied radio frequency analog signal, the second phase shifter cell having a second switching delay time before commencement of the third selectable phase shifting state; wherein the first switching delay time is distinct from the second switching delay time, wherein when the at least one phase shifter cell transitions from the first phase shifting state to the second phase shift state, the at least one phase shifter cell progresses essentially monotonically through multiple intermediate phase values.

34. The phase shifting circuit of claim 33, wherein the second phase shifter cell is configured to provide a fourth selectable phase shifting state for the applied radio frequency analog signal and a second through-path state, wherein during transitions from the third selectable phase shifting state to the fourth selectable phase shifting state, the second phase shifter cell is set to the second through-path state before being set to the fourth selectable phase shifting state.

35. A phase shifting circuit, including:
(a) a first phase shifter cell configured to provide at least a first selectable phase shifting state for an applied radio frequency analog signal, a second selectable phase shifting state for the applied radio frequency analog signal, and a first through-path state for the applied radio frequency analog signal, the first phase shifter cell having a first switching delay time before commencement of transitions from the first selectable phase shifting state to the second selectable phase shifting state, wherein during transitions from the first selectable phase shifting state to the second selectable phase shifting state, the first phase shifter cell is set to the first through-path state before being set to the second selectable phase shifting state; and
(b) a second phase shifter cell coupled in series with the first phase shifter cell and configured to provide a third selectable phase shifting state for the applied radio frequency analog signal, the second phase shifter cell having a second switching delay time before commencement of the third selectable phase shifting state; wherein the first switching delay time is distinct from the second switching delay time, wherein when the at least one phase shifter cell transitions from the first phase shifting state to the second phase shift state, a phase transition behavior of the at least one phase shifter cell is essentially monotonic with state changes.

36. The phase shifting circuit of claim 35, wherein the second phase shifter cell is configured to provide a fourth selectable phase shifting state for the applied radio frequency analog signal and a second through-path state, wherein during transitions from the third selectable phase shifting state to the fourth selectable phase shifting state, the second phase shifter cell is set to the second through-path state before being set to the fourth selectable phase shifting state.

* * * * *